United States Patent [19]
Huang

[11] Patent Number: 5,841,298
[45] Date of Patent: Nov. 24, 1998

[54] LOCALLY ASYNCHRONOUS, PIPELINE-ABLE LOGIC CIRCUITS FOR TRUE-SINGLE-PHASE SYNCHRONOUS LOGIC CIRCUIT

[75] Inventor: Hong-Yi Huang, Changhua, Taiwan

[73] Assignee: Industrial Technology Research Institute, Hsinchu, Taiwan

[21] Appl. No.: 637,468

[22] Filed: Apr. 25, 1996

[51] Int. Cl.[6] ...................... H03K 19/096; H03K 19/094
[52] U.S. Cl. .............................. 326/97; 326/98; 326/46; 326/115
[58] Field of Search ................................. 326/93, 95–98, 326/46, 115; 327/203, 206, 211, 210, 214

[56] References Cited

U.S. PATENT DOCUMENTS

| | | | |
|---|---|---|---|
| 3,267,295 | 8/1966 | Zuk | 327/210 |
| 4,356,411 | 10/1982 | Suzuki et al. | 327/203 |
| 4,570,084 | 2/1986 | Griffin et al. | 327/211 |
| 4,695,744 | 9/1987 | Giordano | 327/210 |
| 5,023,480 | 6/1991 | Gieseke et al. | 327/211 |
| 5,075,578 | 12/1991 | Wendell | 326/98 |
| 5,216,295 | 6/1993 | Hoang | 326/115 |

Primary Examiner—Michael J. Tokar
Assistant Examiner—Richard Roseen
Attorney, Agent, or Firm—Meltzer, Lippe, Goldstein, et al.

[57] ABSTRACT

A pipeline-able asynchronous logic circuit is provided that implements a subfunction of a logic function that is distributed into multiple sequential subfunctions. Each subsequent subfunction is applied to a result of an immediately preceding subfunction of the sequence. The asynchronous logic circuit has an output node and a differential logic circuit connected to the output node via a first path. The differential logic circuit applies a particular subfunction to an inputted signal to produce a result signal. The asynchronous logic circuit also has a sense amplifier that is connected to the output node via a second path which is distinct from the first path. The sense amplifier, in response to being enabled, amplifies the result signal produced by the differential logic circuit. The sense amplifier outputs the amplified result signal onto the output node. The asynchronous logic circuit also has a pre-charge circuit which pre-charges the output node to a first voltage, but only when the sense amplifier is disabled. Furthermore, the asynchronous logic circuit has a first enable circuit which responds to receiving an enable signal by enabling the sense amplifier and outputting the enable signal only when the sense amplifier outputs the amplified result signal. The differential logic circuit drives the output node via the first path, and the sense amplifier drives the output node via the second path, to a voltage corresponding to the result signal.

10 Claims, 8 Drawing Sheets

CLOCK=0
N-SECTION PRECHARGE
P-SECTION EVALUATE
Ln HOLD DATA

CLOCK=1
N-SECTION EVALUATE
P-SECTION PRECHARGE
Lp HOLD DATA

N-SECTION

P-SECTION

LOCALLY ASYNCHRONOUS, PIPELINE-ABLE LOGIC CIRCUITS FOR TRUE-SINGLE-PHASE SYNCHRONOUS LOGIC CIRCUIT

RELATED APPLICATION

The subject matter of this application is related to the subject matter of the following patents and patent applications:

U.S. patent application Ser. No. 08/634,891 entitled "Single Transition Per Evaluation Phase Latch Circuit for Pipelined True-Single-Phase Synchronous Logic Circuit," filed on even date herewith for Hong-Yi Huang.

All of the above-listed patents and patent applications are commonly assigned to the assignee of this application and are incorporated herein by reference.

FIELD OF THE INVENTION

The present invention relates to logic circuits that may be incorporated into integrated circuits. Specifically, the present invention pertains to logic circuits that implement or apply a logic function that is divisible into a sequence of subfunctions, wherein each subfunction of the sequence is applied to the result of the preceding subfunction of the sequence. The present invention pertains to circuits that implement such subfunctions and which are properly sequentially enabled so as to produce the result of the complex logic function.

BACKGROUND OF THE INVENTION

In the field of digital architecture, it is often desirable to implement a complex logic function using digital circuits. For example, in an arithmetic logic unit, a multiplier may be designed which requires a so-called 4–2 addition compressor. See J. M. Masato, *A 10-ns 54×54 Parallel Structure Full Array Multiplier with 0.5 μm CMOS Technology*, IEEE J. SOLID STATE CIRCUITS, vol. SC-26, p.600–606, Apr., 1991. Such a 4–2 addition compressor includes an array of cells that add four bits together. An $i^{th}$ cell 10 of an array of cells is shown in FIG. 1. As shown, the cell 10 includes a full adder 12 that adds three bits X1i, X2i and X3i to produce an intermediate sum ISum and a carry out bit $Cout_i$ (which is inputted to a full adder 14 of the $(i+1)^{th}$ cell 10 of the array). A second full adder 14 receives the bit X4i, the intermediate sum ISum and a carry in bit $Cin_{i-1}$ from another $(i-1)^{th}$ cell 10 of the array and produces the sum bit $Sum_i$ and the carry bit $Carry_i$.

In implementing such a function in logic circuits, the generation of the sum and carry bits $Sum_i$ and $Carry_i$ in the $i^{th}$ cell cannot be performed until the carry in bit $C_{i-1}$ ($Cout_i$) is received from the $(i-1)^{th}$ cell 10 of the array. The generation of the carry out bit $C_{i-1}$ in the $(i-1)^{th}$ cell cannot be performed until the carry in bit $Cin_{i-1}$ ($Cout_{i-2}$) is received from the $(i-2)^{th}$ cell 10 of the array. In short, the carry out bits propagate from cell to cell thereby enabling the performance of the addition.

Note that the above-described complex logic function of the 4–2 addition compressor is divisible into a sequence of subfunctions. Each subfunction is the addition of four bits X1i–X4i and a carry-in bit $Cin_i$ to produce a carry out bit $Cout_i'$, a sum bit $Sum_i$ and a carry bit $Carry_i$. Note also that each $i^{th}$ (for i>2) subfunction of the sequence is applied to at least one result, namely, the carry-in bit $Cin_i$ ($Cout_{i-1}$) generated during the application of the preceding $(i-1)^{th}$ subfunction.

Conventionally, a logic circuit which implements such a logic function that is divisible into sequentially applied subfunctions may be formed according to the true-single-phase clocking architecture 20 shown in FIG. 2. As shown, the logic circuit 20 of FIG. 2 is a synchronous circuit formed by n sequentially connected subcircuits 22-N1, 22-N2, . . . , 22-Nn, a latch 24, p sequentially connected subcircuits 26-P1, 26-P2, . . . , 26-Pp and a latch 28.

Each of the circuits 22-N1, . . . , 22-Nn of the first sequence has enable and pre-charging circuitry 23 which receive the same clock signal labeled φ. Such a clock signal is shown in FIG. 3 having low level pulses (corresponding to a logic '0' value) and high level pulses (corresponding to a logic '1' value). (Typically, the low level of the clock pulses correspond to a zero voltage level and the high level of the clock pulses correspond to a $V_{DD}$ voltage level. Since the low and high levels correspond to opposite polarity logic bits, the low level is said to be of opposite polarity as the high level and the high level is said to be of opposite polarity as the low level.) During a low level pulse, the enable and pre-charge circuitry 23 cause the logic circuits 22-1, . . . , 22-Nn to pre-charge their respective outputs to the high voltage level. Then, during the high level pulse, the logic circuits 22-1, . . . , 22-Nn are enabled. Each of the logic circuits 22-1, . . . , 22-Nn includes circuitry for applying a particular logic subfunction, of a complex logic function. The logic circuit 22-1 receives the initial inputted value on which the entire complex function is to be performed. The result produced at the output N1, N2, . . . , Nn-1 of each logic circuit 22-1, . . . , 22-Nn-1 (other than the last logic circuit 22-Nn) is inputted to the next logic circuit 22-2, . . . , 22-Nn. That is, the logic circuit 22-2 receives the result signal N1 outputted from the logic circuit 22-1, the logic circuit 22-3 receives the result signal N2 outputted from the logic circuit 22-2, etc. Thus, each succeeding logic circuit 22-2, . . . , 22-Nn applies its respective function to the result produced in the immediately preceding logic function, namely, 22-1, . . . , 22-Nn-1, respectively. The result produced in the last logic circuit 22-Nn of the sequence 22-1, . . . , 22-Nn is then stored in the latch 24.

Like the first sequence 22-1, . . . , 22-Nn, each logic circuit of the second sequence 26-1, . . . , 26-Pp has enable and pre-charging circuitry 25 which receive the same clock signal φ. During a high level pulse, the enable and pre-charge circuitry 25 cause the logic circuits 26-1, . . . , 26-Pp to pre-charge their respective outputs to the low voltage level. Then, during the low level pulse, the logic circuits 26-1, . . . , 26-Pp are enabled. Each of the logic circuits 26-1, . . . , 26-Pp includes circuitry for applying a particular logic subfunction of the complex logic function. The logic circuit 26-1 receives the result Ln stored in the latch 24 as an input. The result produced at the output P1, P2, . . . , Pp-1 of each logic circuit 26-1, . . . , 26-Pp-1 (other than the last logic circuit 26-Pp) is inputted to the next logic circuit 26-2, . . . , 26-Pp. That is, the logic circuit 26-2 receives the result signal P1 outputted from the logic circuit 26-1, the logic circuit 26-3 receives the result signal P2 outputted from the logic circuit 26-2, etc. Thus, each succeeding logic circuit 26-2, . . . , 26-Pp applies its respective subfunction to the result produced in the immediately preceding logic function, namely, 26-1, . . . , 26-Pp-1, respectively. The result Pp produced in the last logic circuit 26-Pp of the sequence 26-1, . . . , 26-Pp is then stored in the latch 28. The value Lp stored in the latch 28 may then be outputted as the result of the entire complex logic function.

Thus, the complex logic function is applied as two pipelined sequences of subfunctions into which the complex function is divided. The first sequence of subfunctions is sequentially applied on a high level clock pulse, and the second sequence of subfunctions is applied on a subsequent low level clock pulse.

One disadvantage associated with circuits such as the architecture of FIG. 2 is lies in the latch circuits. FIGS. 4 and 5 shown the latch circuits 24 and 28, respectively, in greater detail. As shown, the latch circuit 24 includes first and second latch subcircuits 24-1 and 24-2 for storing the signal Nn and its complement $\overline{N}n$, respectively. Likewise, the latch circuit 28 includes first and second latch subcircuits 28-1 and 28-2 for storing the signal Pp and its complement $\overline{P}p$, respectively. During the pre-charge phase, the clock is at the low voltage level. By the end of the pre-charge phase, both of the signals Nn and $\overline{N}n$ are driven to the high voltage level. When the evaluation phase initially begins, the clock transitions to a high voltage level. This enables both latch subcircuits 24-1 and 24-2. In particular, the NMOS transistors 24-3 and 24-4 initially drive both output voltages Ln and $\overline{L}n$ to the low voltage level. Eventually, by the end of the evaluation phase, one of the signals Nn and $\overline{N}n$ will remain at the high voltage level and the other signal will transition to the low voltage level. Assume that Nn remains at the high voltage level and $\overline{N}n$ transitions to the low voltage level. As a result, the output Ln of the latch subcircuit 24-2 is driven to the high voltage level by PMOS transistor 24-5. The next pre-charge phase then occurs during which both Nn and $\overline{N}n$ are driven to the high voltage level. Thus, when the next evaluation phase begins, both output signals Ln and $\overline{L}n$ are driven to the low voltage level followed by driving one of the outputs Ln and $\overline{L}n$ to the high voltage level later during the same evaluation phase.

Consider that during each evaluation phase, the voltage level of one of the signals Ln or $\overline{L}n$ transitions from high to low and then transitions back to high again. Simply stated, the conventional latch circuit 24 causes one of the latch subcircuits 24-1 or 24-2 to transition twice during every evaluation phase. This is illustrated in FIG. 6. Likewise, FIG. 7 illustrates the two transitions of the latch 28 during the evaluation phase. The two transitions of the conventional latch 24 or 28 are disadvantageous because the extra, unneeded transition wastes power.

A second disadvantage with the true-single-phase clock architecture shown in FIG. 2 is that the enable and pre-charge circuitry 23 pre-charge all of the outputs N1, ..., Nn simultaneously. Likewise, the enable and pre-charge circuitry 25 pre-charge all of the outputs P1, ..., Pp simultaneously. This can induce large transient current spikes on the low and high supply voltage power supply busses. Such spikes can induce noise that can couple to other circuits connected to the low and high power supply busses.

FIG. 8 shows an alternative architecture 30 for applying a complex function as a sequence of subfunctions. The architecture 30 in FIG. 8 does not use either a true-single-phase clock or latch circuits. Rather, the architecture 30 of FIG. 8 is formed from asynchronous logic circuits 32-1, 32-2, ..., 32-n called enable/disable CMOS differential logic (ECDL) circuits. Each ECDL circuit 32-1, 32-2, ..., 32-n applies a respective subfunction of the sequence of subfunctions of the complex function to a respective inputted signal $Q_0, Q_1, Q_2, \ldots, Q_{n-1}$. As a result of applying its respective subfunction to its inputted signal, each ECDL circuit 32-1, 32-2, ..., 32-n generates a resulting signal $Q_1, Q_2, \ldots, Q_n$. Thus, the result signal $Q_1$ generated by the ECDL circuit 32-1 is provided as the input signal to the ECDL circuit 32-2, the result signal $Q_2$ generated by the ECDL circuit 32-2 is provided as the input signal to the ECDL circuit 32-3, etc. The input signal $Q_0$ provided to the first ECDL circuit 32-1 is the input signal to which the entire complex logic function is to be applied. The result signal $Q_n$ produced by the ECDL circuit 32-m is the result of applying the entire complex function to the input signal.

In addition to receiving input signals, each ECDL circuit 32-1, ..., 32-n also receives an enable signal $E_0, E_1, \ldots, E_{n-1}$, respectively (the ECDL circuit 32-1 receiving the enable signal $E_0$, the ECDL circuit 32-2 receiving the enable signal E2, etc.) Each ECDL circuit, e.g., the ECDL circuit 32-1, propagates its received enable signal, i.e., $E_0$, to the outputted enable signal, i.e., $E_1$ after a predetermined delay. Specifically, each ECDL circuit, e.g., the ECDL circuit 32-1, is designed so as to output its output enable signal, i.e., $E_1$, when its result signal, i.e., $Q_1$, is available for receipt by the next ECDL circuit, i.e., the ECDL circuit 32-2. This ensures that each ECDL circuit 32-1, ..., 32-n is enabled only when its respective inputs signal, to which it must apply its respective subfunction, is available.

FIG. 9 shows an illustrative ECDL circuit 40 in greater detail. As shown, the ECDL circuit 40 includes, an enable circuit 42, a sense amplifier 44, a pre-charge circuit 46 and an NMOS differential network 48. The ECDL circuit 40 illustratively is an $i^{th}$ ECDL circuit in a series of ECDL circuits. The ECDL circuit 40 receives the enable signal $E_{i-1}$ and the result signal(s) $Q_{i-1}$ from the preceding $(i-1)^{th}$ ECDL circuit.

The enable signal $E_{i-1}$ is received at the enable input of each of two drivers 46-1 and 46-2 of the pre-charge circuit 46. Illustratively, each driver 46-1 and 46-2 is an NMOS transistor N5 or N6 having its drain connected to an output node that outputs the signal $Q_i$ or an output node that outputs the complement of the signal $Q_i$, namely, the signal $\overline{Q}_i$, and its source connected to a low level voltage node (ground). In response to receiving a high level (disabling) enable signal, the drivers 46-1 and 46-2 of the pre-charge circuit 46 preliminarily drive the $Q_i$ and $\overline{Q}_i$ output nodes to a low level voltage. In response to receiving a low level (enabling) enable signal, the pre-charge circuit 46 refrains from driving the output nodes $Q_i$ or $\overline{Q}_i$ to any particular voltage.

The enable signal $E_{i-1}$ is also received at a first inverter 42-1 of the enable circuit 42. The enable circuit 42 has two serially connected inverters 42-1 and 42-2 which are both push-pull configuration inverters. Each inverter 42-1 and 42-2 includes a PMOS transistor P3 (P4) having its source connected to a high level voltage node ($V_{DD}$) and an NMOS transistor N3 (N4) having its source connected to the low voltage node (ground). The drains of the PMOS and NMOS transistors P3 and N3 (P4 and N4) are commonly connected to an output of the inverter 42-1 (42-2). The gates of the PMOS and NMOS transistors P3 and N3 (P4 and N4) are commonly connected to the input of the inverter 42-1 (42-2). In response to the enable signal $E_{i-1}$, the inverter 42-1 outputs the complement of the received enable signal (of opposite polarity) at its output. This complementary valued signal is received at the input of the inverter 42-1 which outputs the complement thereof as the enable signal $E_i$. Illustratively, the inverters 42-1 and 42-2 are designed so as to delay the outputting of the enable signal $E_i$ until the ECDL circuit 40 has produced the result signal(s) $Q_i$ from the input signal(s) $Q_{i-1}$.

The complement of the enable signal outputted form the inverter 42-1 of the enable circuit 42 is received at a high level biasing node Si of the sense amplifier 44. The sense amplifier 44 is formed from two inverters 44-1 and 44-2. Each inverter 44-1 and 44-2 is formed from a common drain connection of a PMOS transistor and an NMOS transistor, i.e., P1 and N1 in the case of inverter 44-1 or P2 and N2 in the case of inverter 44-2. The gates of both transistors P1 and N1 of the inverter 44-1 are connected to the output (common drain connection) of the inverter 44-2. Likewise, the gates of the transistors P2 and N2 of the inverter 44-2 are both connected to the output (common drain connection) of the inverter 44-1. The sources of the NMOS transistors N1 and N2 of both inverters are connected to the low level voltage node (ground). The output node of the inverter 44-1 serves as the $Q_i$ output node at which the result signal $Q_i$ is generated and the output node of the inverter 44-2 serves as the $\overline{Q}_i$ output node at which the complement of the result signal $\overline{Q}_i$ is generated.

When the signal received at the high level biasing node Si is a low level, the inverters 44-1 and 44-2 are both disabled and do not drive the Q1 or Q1' output nodes to any particular voltage. When the signal received at the high level biasing node Si is a high level, the inverters 44-1 and 44-2 are enabled. When enabled, one inverter 44-1 or 44-2 will drive its output node to a high level and the other inverter 44-2 or 44-1 will drive its node to a low level. This is described in greater detail below.

The NMOS differential network 48 receives the result signal(s) $Q_{i-1}$ from the previous $(i-1)^{th}$ ECDL circuit 40. In response, the NMOS differential network 48 applies a predetermined subfunction of a complex logic function to the output signals. As a result, the NMOS differential network 48 produces a result signal of one polarity and a complement of the result signal of opposite polarity. The NMOS differential network 48 outputs the result signal to the $Q_i$ output node and the complement of the result signal to the $\overline{Q}_i$ output node. Illustratively, the NMOs differential network 48 is implemented using small, low current driving and low power dissipating transistors.

The operation of the ECDL circuit 40 is now described. Initially, a high level enable signal $E_0$ is inputted to the first ECDL circuit of the sequence, thereby causing the $i^{th}$ ECDL circuit to receive a high level enable signal $E_{i-1}$. The inverter 42-1 of the enable circuit therefore outputs a low level signal to the biasing node Si. As a result, the inverters 44-1 and 44-2 of the sense amplifier 44 are disabled and do not drive the $Q_i$ output node or the $\overline{Q}_i$ output node to any particular voltage. The inverter 42-2 of the enable circuit 42 outputs the complement of the complement of the enable signal $E_{i-1}$, namely, a high level as the enable signal $E_i$. Meanwhile, the high level enable signal $E_{i-1}$ is received at the drivers 46-1 and 46-2 of the pre-charge circuit 46. As a result, the pre-charge circuit 46 preliminarily drives the $Q_i$ output node and the $\overline{Q}_i$ output node to the low level. The drive of the drivers 46-1 and 46-2 is much greater than the drive produced by the NMOS differential network 48. Thus, the drivers 46-1 and 46-2 can drive the $Q_i$ and $\overline{Q}_i$ output nodes nearly entirely to the low voltage level.

Now assume that the $(i-1)^{th}$ outputs a low level enable signal $E_{i-1}$ and its result signal(s) $Q_{i-1}$. The low level enable signal $E_{i-1}$ disables the drivers 44-1 and 44-2 of the precharge circuit 44 which refrain from driving the $Q_i$ and $\overline{Q}_i$ output nodes. The inverter 42-1 of the enable circuit 42 outputs a high voltage level complement of the enable signal $E_{i-1}$ to the inverter 42-2 and the biasing node Si. The high voltage level of the biasing node enables the inverters 46-1 and 46-2 of the sense amplifier circuit 46. Meanwhile, the result signal(s) $Q_{i-1}$ are received at the NMOS differential network circuit 48. In response, the NMOS differential network 48 applies its respective subfunction to the signal(s) $Q_{i-1}$ to produce a result signal $Q_i$. If $Q_i$ is a high voltage level, the NMOS differential network drives the $Q_i$ output node to a high voltage level and drives the $\overline{Q}_i$ output node to a low voltage level. Alternatively, if the result signal is a low voltage level, the NMOS differential network drives the $Q_i$ output node to a low voltage level and drives the $\overline{Q}_i$ output node to a high voltage level.

Assume for sake of illustration that the result signal $Q_i$ is a high voltage level. The increasing voltage level resulting from the drive of the $Q_i$ output node by the NMOS differential network 48 is received at the inverter 46-2. This causes the PMOS transistor P2 to remain/turn off and the NMOS transistor N2 to remain/turn on. Likewise, the low voltage level of the $\overline{Q}_i$ output node (resulting from the preliminary drive by the driver 42-2 of the pre-charging circuit and the drive of the $\overline{Q}_i$ output node by the NMOS differential network 48) is received at the inverter 46-1. This causes the transistor P1 to remain/turn on and the transistor N1 to remain/turn off. Illustratively, the transistor P1 has a high current driving capacity so as to fully drive the Q1 output node to the high voltage level. Likewise, the transistor N2 has a high current driving capacity so as to fully drive the $\overline{Q}_i$ output node to the low voltage level. Note that in the case that the result signal is a low voltage level, the transistors P2 and N1 would turn/remain on and the transistors P1 and N2 would turn/remain off so as to drive the $Q_i$ output node to the low voltage level and to drive the $\overline{Q}_i$ output node to the high voltage level.

Illustratively, at or after the time that the sense amplifier has driven the $Q_i$ output node to the correct voltage level of the result signal, the inverter outputs the enable signal $E_i$ having the same low voltage level as the enable signal $E_{i-1}$. Thus, the $(i+1)^{th}$ stage (or final output) is enabled but only when the result signal $Q_i$ is available for output to the $(i+1)^{th}$ stage (or final output). This is illustrated in the timing diagram shown in FIG. 10. As shown, when $E_0$ is initially high, $E_{i-1}$ is also high and the output signals $Q_{i-1}, \overline{Q}_{i-1}, Q_i$ and $\overline{Q}_i$ are all low. Some time after $E_0$ transitions from a high voltage level to a low voltage level, the enable signal $E_{i-1}$ transitions from a high voltage level to a low voltage level. This coincides with the result signal $Q_{i-1}$ being available for input to the $i^{th}$ ECDL circuit 40. The $i^{th}$ ECDL circuit 40 generates the result signal $Q_i$ thereafter and outputs the enable signal $E_i$ at or after the time that the result signal $Q_i$ is outputted.

Note also that the enable signal $E_{i-1}$ does not rise to the high voltage level until sometime after the enable signal $E_0$ rises to the high voltage level. The rise of the enable signal $E_{i-1}$ to the high voltage level causes the pre-charge circuit 42 to drive the signals $Q_i$ and $\overline{Q}_i$ to the low voltage level. At, or shortly after that time, the enable signal $E_i$ rises to the high voltage level. The net effect is that the signals $Q_{i-1}$ and $\overline{Q}_{i-1}$ are pre-charged, i.e., driven to the low voltage level, slightly before, i.e., at a different time, than the time at which the signals $Q_i$ and $\overline{Q}_i$ are precharged.

The asynchronous architecture 30 with ECDL circuits avoids the problem of simultaneous pre-charging by all of the asynchronous subcircuits 32-1, . . . , 32-n. However, the asynchronous circuit architecture 30 is disadvantageous because it is operated without generating completion signals and has difficulty in synchronizing with, and communicating between, different systems (with different clock sources). This makes a purely asynchronous system more difficult to implement. In addition, the ECDL circuit, while capable at operating at high speed, may not be sufficiently fast in certain applications. In any event, the ECDL dissipates a large amount of power.

It is an object to overcome the disadvantages of the prior art.

SUMMARY OF THE INVENTION

This and other objects are achieved by the present invention. According to one embodiment, a pipeline-able asynchronous logic circuit is provided that implements a subfunction of a logic function that is distributed into multiple sequential subfunctions. Each subsequent subfunction is applied to a result of an immediately preceding subfunction of the sequence. The asynchronous logic circuit has an output node and a differential logic circuit connected to the output node via a first path. The differential logic circuit applies a particular subfunction to an inputted signal to produce a result signal. The asynchronous logic circuit also has a sense amplifier that is connected to the output node via a second path which is distinct from the first path. The sense amplifier, in response to being enabled, amplifies the result signal produced by the differential logic circuit. The sense amplifier outputs the amplified result signal onto the output node. The asynchronous logic circuit also has a pre-charge circuit which pre-charges the output node to a first voltage, but only when the sense amplifier is disabled. Furthermore, the asynchronous logic circuit has a first enable circuit which responds to receiving an enable signal by enabling the sense amplifier and outputting the enable signal only when the sense amplifier outputs the amplified result signal. The differential logic circuit drives the output node via the first path, and the sense amplifier drives the output node via the second path, to a voltage corresponding to the result signal.

Illustratively, by providing two drive paths for the asynchronous logic circuit outputs, namely, one from the differential logic circuit, and one from the sense amplifier, the propagation delay between the time at which the enable signal and input signal are received and the time at which the result signal is outputted is reduced. Furthermore, the power consumption of the asynchronous logic circuit is also reduced.

Illustratively, a globally synchronous, locally asynchronous logic circuit may be formed for evaluating a complex logic function as follows. A complex logic function is divided into two sequences of subfunctions. A first sequence of asynchronous logic circuits, that are enabled by an enable signal of a first polarity, and a second sequence of asynchronous logic circuits, that are enabled by an enable signal of a second, opposite polarity are formed. A first latch is connected between the two sequences of asynchronous logic circuits and a second latch is connected to the last asynchronous logic circuit of the second sequence of asynchronous logic circuits. Both of the latches receive the same clock signal, which is also inputted as an enable signal to the first asynchronous logic circuit of the first sequence. The first asynchronous logic circuit of the first sequence also receives the inputted signal, to which the entire complex logic function is to be applied, during a clock pulse of the first polarity. The first latch is enabled to store the result of the first sequence, during the clock pulse of the first polarity, and the second latch is enabled to store the result of the second sequence, during a clock pulse of the second polarity.

DETAILED DESCRIPTION OF THE INVENTION

Figure 11:
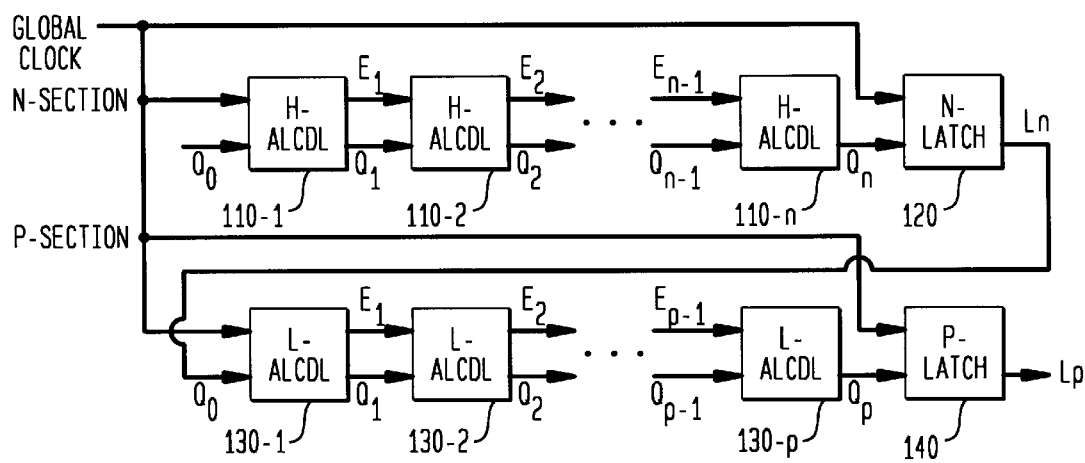
FIG. 11 shows an architecture according to an embodiment of the present invention.

FIG. 11 shows a general circuit architecture 100 for evaluating a complex function, that is divisible into subfunctions, according to an embodiment of the present invention. As shown, the logic circuit 100 includes a first sequence of one or more asynchronous logic circuits 110-1, 110-2, . . . , 110-n, a first latch 120, a second sequence of one or more asynchronous logic circuits 130-1, 130-2, . . . , 130-p, and a second latch 140. The complex function to be applied to the input signal is divided or distributed into two successive sequences of subfunctions, wherein the result of a preceding subfunction is the input of the very next succeeding subfunction in each sequence. Each of the subfunctions of the complex function is then assigned to a particular circuit 110-1, . . . , 110-n and 130-1, . . . , 130-p in a fashion that evaluates the complex function.

Figure 1:
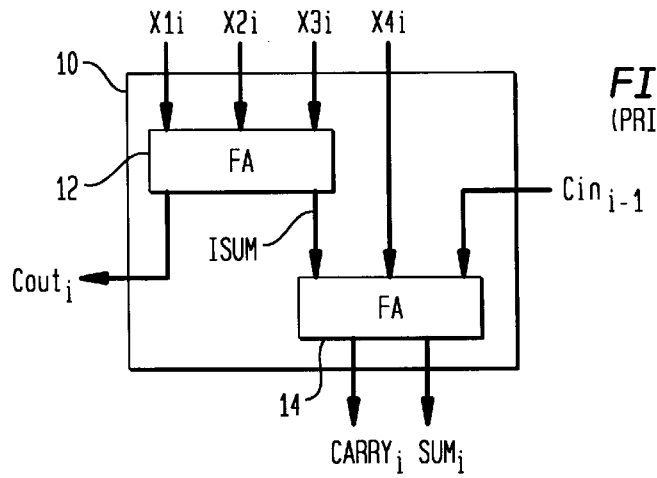
FIG. 1 shows a conventional 4–2 addition compressor.
Figure 2:
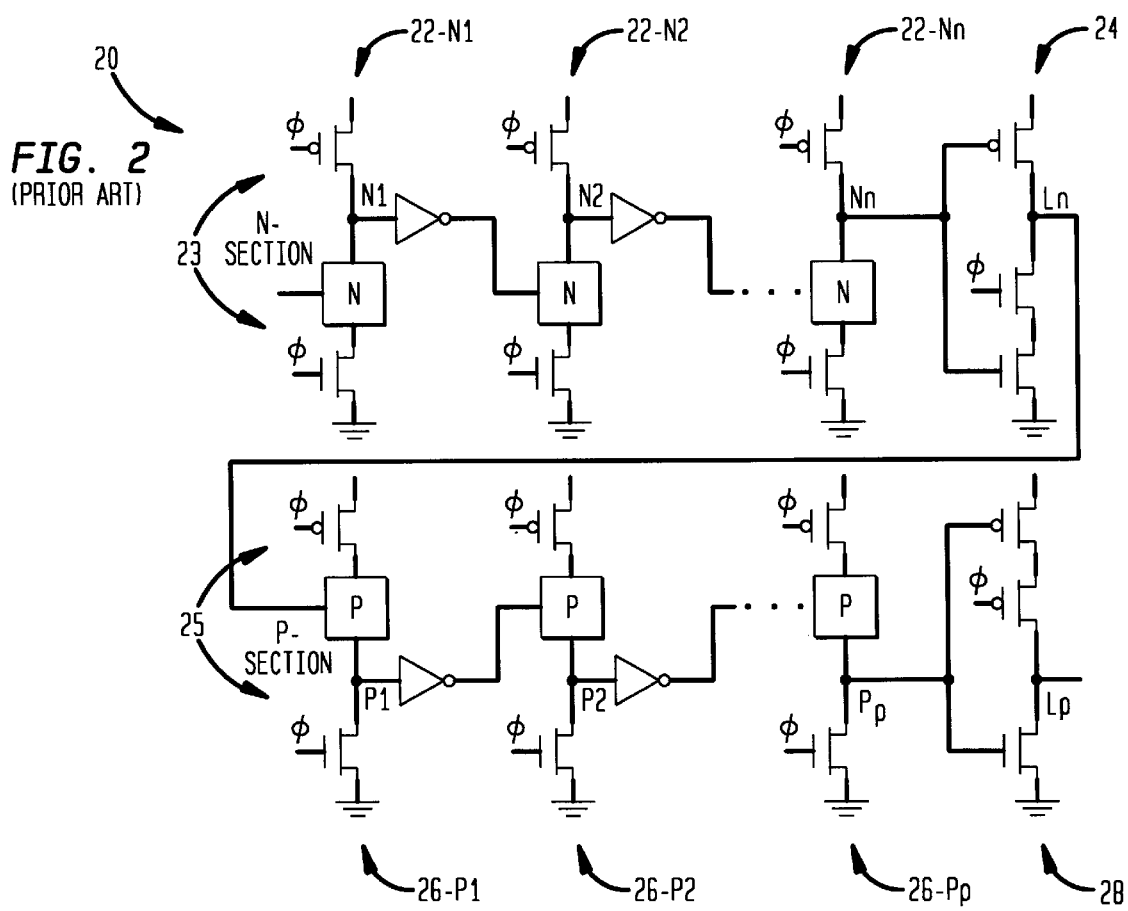
FIG. 2 shows a conventional true-single-phase clock logic circuit for applying a complex logic function to an input signal.
Figure 3:
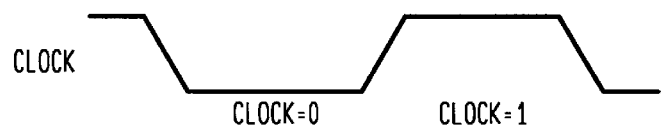
FIG. 3 shows a graph plotting timing signals of the circuit of FIG. 2.
Figure 4:
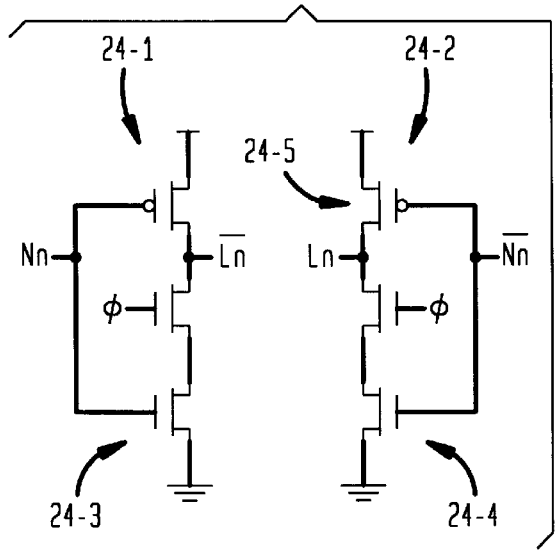
FIGS. 4 and 5 show conventional latch circuits used in true-single-phase clock logic circuits.
Figure 5:
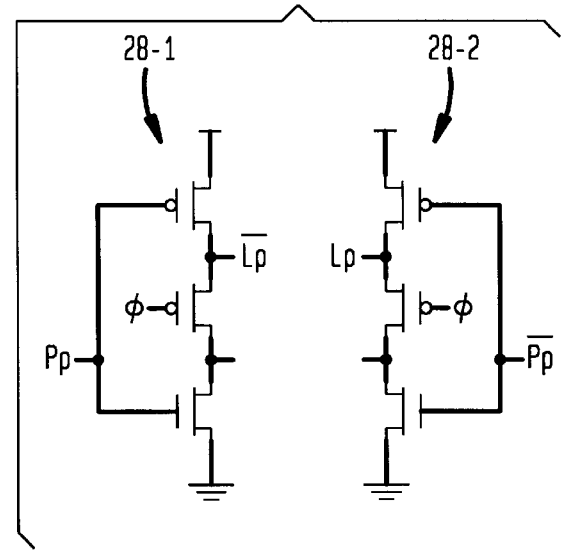
Figure 6:
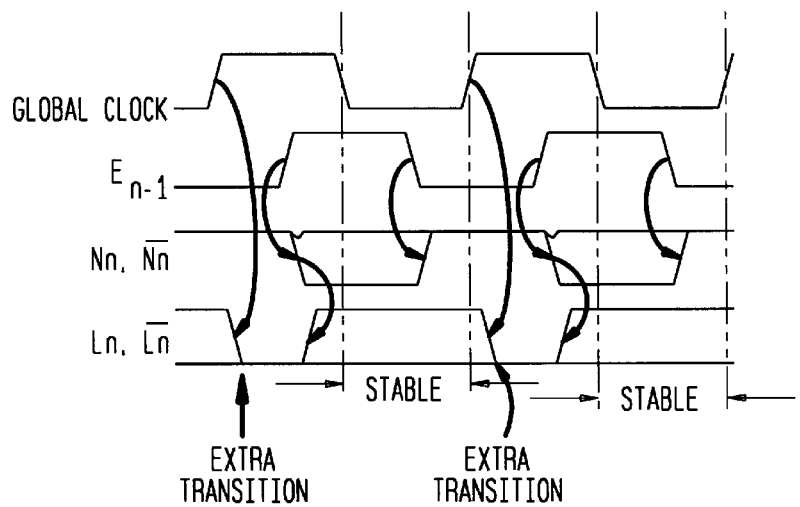
FIGS. 6 and 7 show graphs plotting timing signals of the circuits of FIGS. 4 and 5, respectively.
Figure 7:
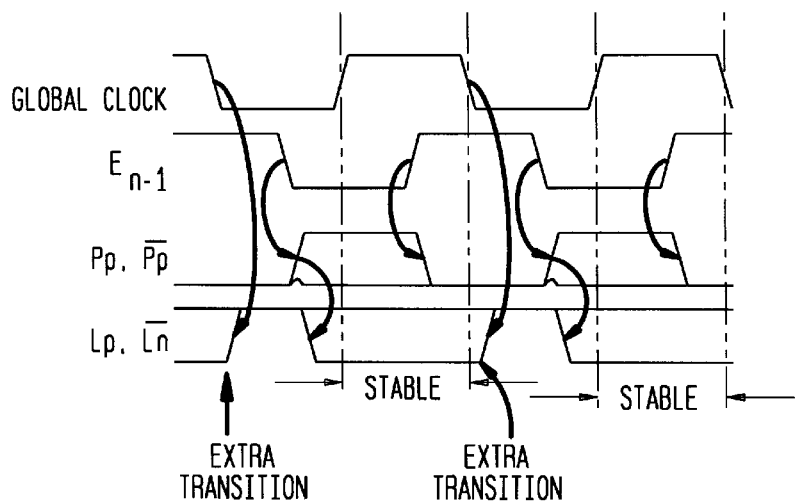

Like the true-single-phase clock architecture 20 of FIG. 2, the latch circuits 120 and 140 are synchronous circuits. In addition, the asynchronous logic circuits 110-1, . . . , 110-n and first latch circuit 120 pre-charge during a first polarity (e.g., low) level voltage pulse of the clock signal. The asynchronous logic circuits 110-1, . . . , 110-n are enabled to evaluate/apply their respective logic functions to inputted signals during a second opposite polarity (e.g., high) level voltage pulse of the clock signal, and the first latch 120 stores the result generated by the sequence of asynchronous logic circuits 110-1, . . . , 110-n. Likewise, the asynchronous logic circuits 130-1, . . . , 130-n and second latch circuit 140 pre-charge during the second polarity (e.g.,high) level voltage pulse of the clock signal. The asynchronous logic circuits 130-1, . . . , 130-p are enabled to evaluate/apply their respective logic functions to inputted signals during the first polarity (e.g., low) level voltage pulse of the clock signal, and the second latch 140 stores the result generated by the sequence of asynchronous logic circuits 130-1, . . . , 130-p.

Unlike the architecture 20 of FIG. 2, the circuits 110-1, . . . , 110-n and 130-1, . . . , 130-p do not all receive the global clock and do not evaluate or pre-charge in unison. Rather, the global clock and inputted signal(s) $Q_0$ on which the entire complex function is to be applied, are inputted to the first logic circuit 110-1. The logic circuit 110-1 applies a respective subfunction to the input signal(s) and produces a result signal $Q_1$. The logic circuit 110-1 also at that time, or shortly thereafter, generates the enable signal $E_1$. The result signal $Q_1$ is outputted to the circuit 110-2 as an input signal and the enable signal $E_1$ is outputted to enable the circuit 110-2. The circuits 110-2, ..., 110-n propagate their result and enable signals in a like fashion. Finally, the result signal $Q_n$ generated by the circuit 110-n is stored in the latch 120 as the signal Ln. Likewise, the second polarity level clock pulse is received as an enable signal at the circuit 130-1, which also receives the result signal $L_n$ stored in the latch 120. In a like fashion as the circuits 110-1, ..., 110-n, the circuits 130-1, ..., 130-p propagate their results and enable signals to one another. The result signal $Q_p$ generated by the circuit 130-p is outputted to the latch 140 where it is stored as the signal Lp. The signal $L_p$ stored in the latch 140 is the result of the complex function as applied to the input signal $Q_0$.

While the circuits 130-1, ..., 130-p are evaluating/applying their respective subfunctions during the second polarity clock pulse, the circuits 110-1, ..., 110-n pre-charge their outputs. The second polarity level of the clock pulse is received in the circuit 110-1 which responds by driving the signal $Q_1$ to, for example, the first polarity voltage level. The circuit 110-1 then propagates the second polarity level enable signal $E_1$ to the circuit 110-2, which in turn drives its output signal $Q_2$ to the first polarity voltage level. Thus, the circuits 110-1, ..., 110-n do not pre-charge their outputs in unison but rather sequentially pre-charge their outputs at different times. The circuits 130-1, ..., 130-p likewise sequentially pre-charge their outputs to, for example, the second polarity voltage level.

In short, the architecture 100 offers the following benefits. The use of the global clock for the latches 120 and 140 provides appropriate completion signals that synchronize the receipt of the final result $L_p$ with the global clock. This overcomes problems associated with synchronizing the result with another system. On the other hand, the "local" asynchronicity of the logic circuits 110-1, ..., 110-n and 130-1, ..., 130-p ensure that the circuits do not rely on the clock for synchronization and do not operate in unison. The first consequence simplifies the global clock generator as the global clock generator does not have to account for skew in the clock as received on a lengthy clock bus. The second consequence reduces the power spikes on the power supply busses and therefore reduces noise.

Below, the architecture of the asynchronous logic circuits 110-1, ..., 110-n and 130-1, ..., 130-p and the latches 120 and 140 are separately discussed.

ASYNCHRONOUS LOGIC CIRCUIT ARCHITECTURE

Figure 8:
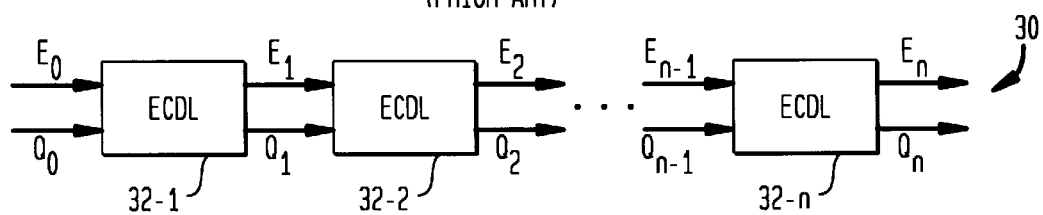
FIG. 8 shows a conventional asynchronous architecture for applying a complex logic function to an input signal.
Figure 12:
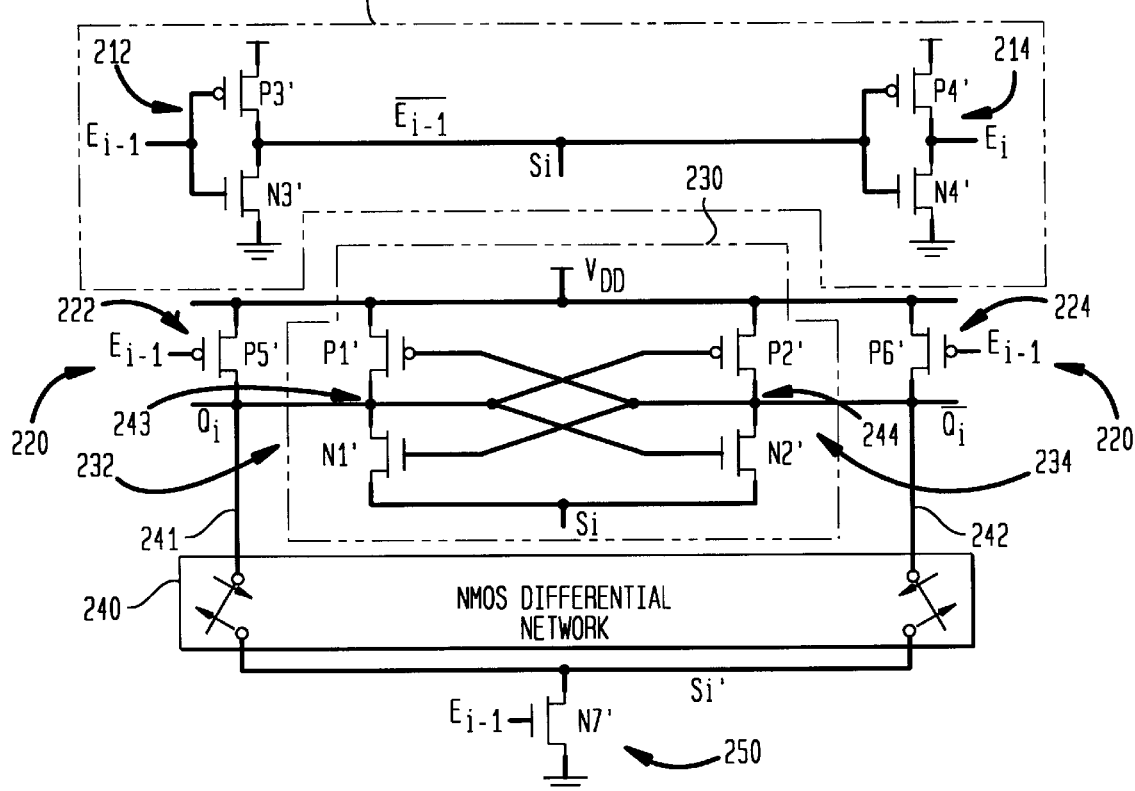
FIG. 12 shows an H-ALCDL circuit according to an embodiment of the present invention.
Figure 13:
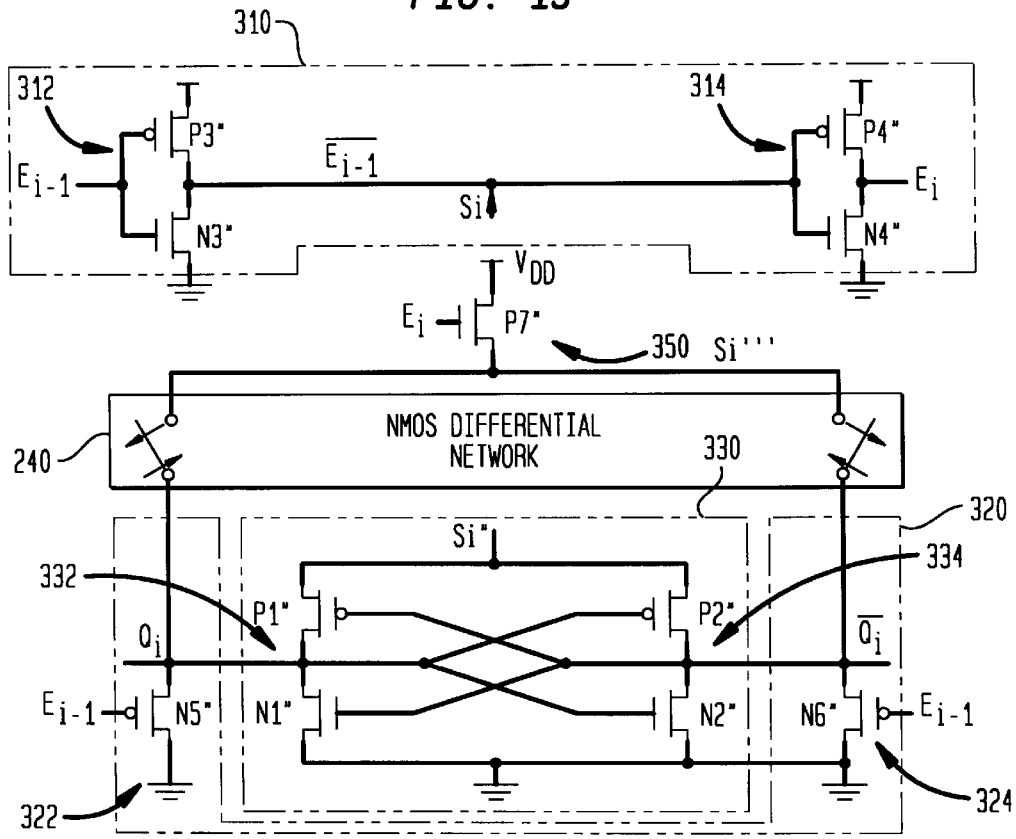
FIG. 13 shows an L-ALCDL circuit according to an embodiment of the present invention.

FIGS. 12 and 13 show asynchronous logic circuit architectures 200 and 300 according to an embodiment of the present invention. The asynchronous logic circuits can be used in the architecture 100 shown in FIG. 11 or the architecture 30 of FIG. 8. The circuit 200 in FIG. 12 is called a high or pre-charge asynchronous latched CMOS differential logic circuit or H-ALCDL. The H-ALCDL 200 illustratively is used to implement each asynchronous logic circuit 110-1, ..., 110-n of the circuit 100 of FIG. 11. The H-ALCDL is so-called because it drives its output signals $Q_i$ and $\overline{Q}_i$ to a high voltage level during the pre-charge phase. The circuit 300 in FIG. 13 is called a low or pre-discharge asynchronous latched CMOS differential logic circuit or L-ALCDL. The L-ALCDL 300 illustratively is used to implement each asynchronous logic circuit 130-1, ..., 130-p of the circuit of FIG. 11. The L-ALCDL circuit 300 is so called because it drives its output signals $Q_i$ and $\overline{Q}_i$ to a low voltage level during the pre-charge (more precisely, "predischarge") phase.

Referring to FIG. 12, the H-ALCDL 200 illustratively is an $i^{th}$ asynchronous logic circuit in a sequence of asynchronous logic circuits. The H-ALCDL 200 has an enable circuit 210, a pre-charge circuit 220, a sense amplifier 230, an NMOS differential network circuit 240 and a second enable circuit 250. The enable circuit 210 includes two inverters 212 and 214. The inverter 212 includes the PMOS transistor P3' and NMOS transistor N3' connected in a standard push-pull configuration. The inverter 214 includes the PMOS transistor P4' and the NMOS transistor N4' connected in push-pull configuration. The inverter 212 receives the enable signal $E_{i-1}$ (e.g., outputted from the $(i-1)^{th}$ previous asynchronous logic circuit in the sequence, or the global clock circuit if the H-ALCDL 200 is the first asynchronous logic circuit in the sequence). In response, the inverter 212 outputs the complement of the signa $E_{i-1}$, namely, $\overline{E}_{i-1}$ to the biasing node Si of the sense amplifier 230 and to the input of the inverter 214. The inverter 214 outputs the complement of the complement enable signal $\overline{E}_{i-1}$ as the outputted enable signal $E_i$. The inverters 212 and 214 are designed with a particular propagation delay so that the signal $E_i$ is not outputted until the result signal(s) $Q_i$ generated by the sense amplifier 230 are outputted. This ensures that the very next $(i+1)^{th}$ asynchronous logic circuit in the sequence is not enabled to apply its respective logic subfunction until it has the correct input signal(s), namely, the result signal(s) $Q_i$.

The pre-charge circuit 220 includes two drivers 222 and 224. Illustratively, each of the drivers 222 and 224 is a PMOS transistor P5' or P6', respectively. The transistor P5' has a source connected to the high voltage level node $V_{DD}$ and a drain (output) connected to the $Q_i$ output node of the H-ALCDL 200. The transistor P6' has a source connected to the high voltage level node $V_{DD}$ and a drain (output) connected to the $\overline{Q}_i$ output node of the H-ALCDL 200. The gate of both transistors P5' and P6' receives the enable signal $E_{i-1}$. In response to a low voltage level enable signal $E_{i-1}$ (disabling or pre-charge polarity of enable signal), the driver 222 drives the $Q_i$ output node to the high voltage level and the driver 224 drives the $\overline{Q}_i$ output node to the high voltage level. Thus, the pre-charge circuit 220 pre-charges the $Q_i$ and $\overline{Q}_i$ output nodes. In response to a high voltage level enable signal $E_{i-1}$ (enabling or evaluate/apply polarity of enable signal), the drivers 222 and 224 are turned off and do not drive the $Q_i$ and $\overline{Q}_i$ output nodes to any particular voltage.

The sense amplifier 230 includes two inverters 232 and 234. The inverter 232 includes a PMOS transistor P1' and an NMOS transistor N1' connected in a push-pull configuration. The inverter 234 includes a PMOS transistor P2' and an NMOS transistor N2' connected in a push-pull configuration. The high voltage level biasing inputs of the inverters 232 and 234 are connected to the high voltage level node $V_{DD}$. The low voltage level biasing inputs of the inverters 232 and 234 are connected to the node Si. The input of the inverter 232 is connected to the output of the inverter 234, which is also connected to the $\overline{Q}_i$ output node. The input of the inverter 234 is connected to the output of the inverter 232, which is also connected to the $Q_i$ output node.

In operation, when the voltage at the node Si is a high voltage level, the inverters 232 and 234 are not properly biased and therefore do not drive the $Q_i$ and $\overline{Q}_i$ output nodes to any particular voltage. This would occur when the inverter 212 of the enable circuit, in response to a low level enable signal $E_{i-1}$, outputs a high level complement enable signal $\overline{E}_{i-1}$ to the biasing node Si. On the other hand, when the voltage level of the node Si is a low voltage level, the inverters 232 and 234 are properly biased. Whichever of the two signals $Q_i$ and $\overline{Q}_i$ is driven to the higher voltage (by the NMOS differential network circuit 240) controls the operation of the inverters. For instance, assume that the signal $Q_i$ is driven to a higher voltage level than the signal $\overline{Q}_i$. As such, the transistor P2' of the inverter 234 turns off and the transistor N2' turns on so as to drive the $\overline{Q}_i$ output node to the low voltage level. The drive of the signal $\overline{Q}_i$ to the low voltage level turns on the transistor P1' of the inverter 232 and turns off the transistor N1' so as to further drive the signal $Q_i$ to the high voltage level. If instead, the signal $\overline{Q}_i$ is driven to a higher voltage level than the signal $Q_i$, the transistor P1 ' of the inverter 232 is turned off and the transistor N1' is turned on to further drive down the voltage of the $Q_i$ output node to the low voltage. Likewise, the transistor P2' of the inverter 234 is turned on and the transistor N2' is turned off to further drive up the voltage of the $\overline{Q}_i$ output node to the high voltage level.

Figure 14:
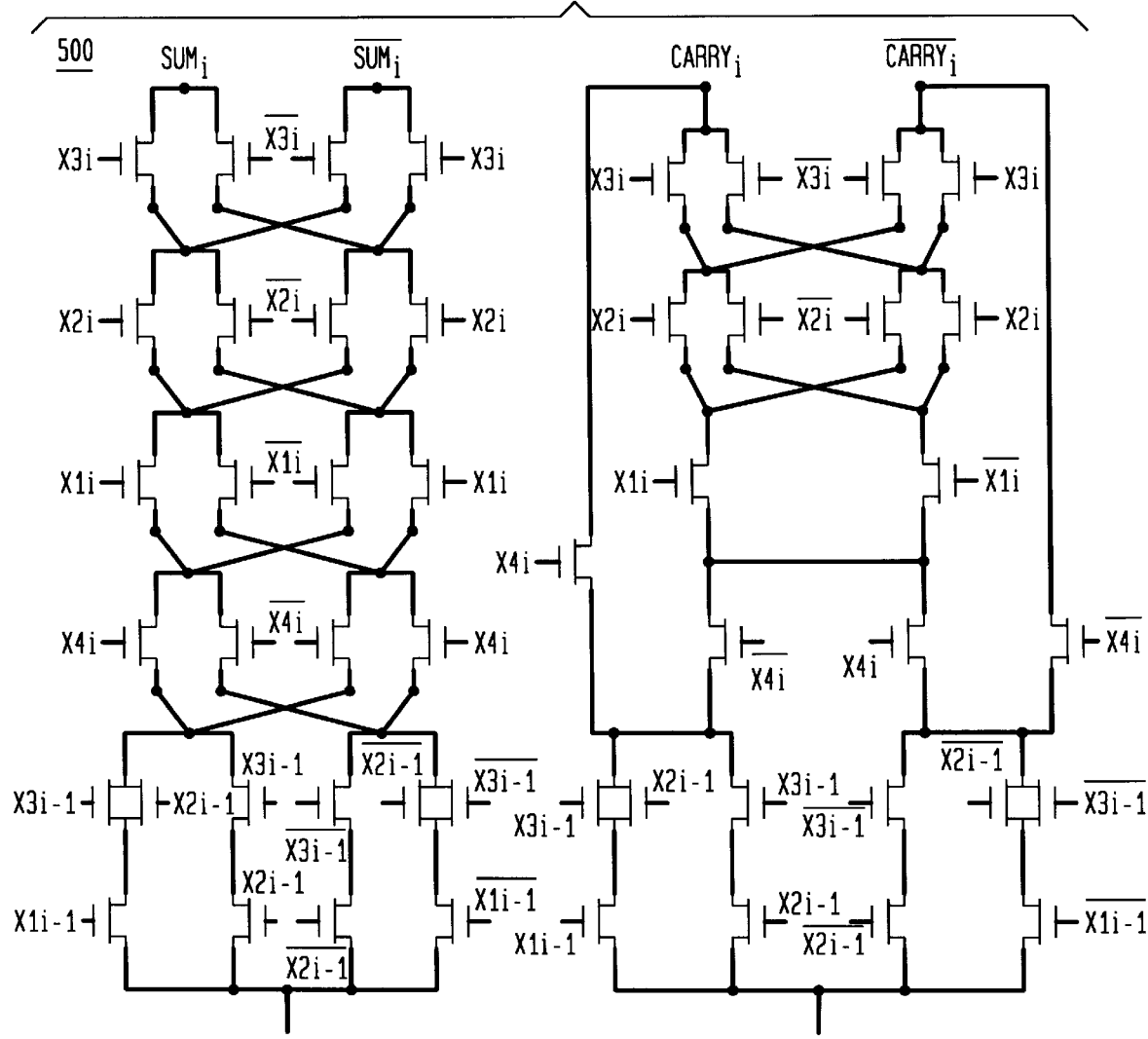
FIG. 14 shows an exemplary differential network which can illustratively be employed in the circuits of FIGS. 12 and 13.

The NMOS differential network 240 is a connection of NMOS transistors that apply a particular subfunction of the complex function to the input signal(s) $Q_{i-1}$ to produce the result signals $Q_i$ and $\overline{Q}_i$. Note that the signal $\overline{Q}_i$ is the complement of the signal $Q_i$. Therefore, if the NMOS differential network 240 generates a high voltage level for the signal $Q_i$, the NMOS differential network 240 generates a low voltage level for the signal $\overline{Q}_i$ and vice-versa. An example of an NMOS differential network is shown in FIG. 14.

The NMOS differential network 240 has a low voltage biasing node Si' to which a second enable circuit 250 is connected. The enable circuit 250 includes an NMOS transistor N7' having a source connected to the low voltage level node GND, a drain (output) connected to the low voltage biasing node Si' and a gate receiving the enable signal $E_{i-1}$. When the enable voltage $E_{i-1}$ is a low voltage level (i.e., a disabling or pre-charge phase voltage), the transistor N7' is off and does not drive the low voltage biasing node Si' to any particular voltage. As such, the NMOS differential network circuit 240 is not properly biased and is disabled (i.e., does not drive the signals $Q_i$ or $\overline{Q}_i$ to any particular voltage). On the other hand, when the enable signal $E_{i-1}$ is a high voltage level (i.e., an enabling or evaluate/apply phase voltage), the transistor N7' turns on and drives the low voltage biasing node Si' to GND. This enables the NMOS differential network circuit 240. When enabled, the NMOS differential network outputs a voltage level for the signal $Q_i$ to the $Q_i$ output node, and a voltage level for the signal $\overline{Q}_i$ to the $\overline{Q}_i$ output node. These voltage levels for the signals $Q_i$ and $\overline{Q}_i$ are amplified by the sense amplifier 230 which amplifies them and outputs the amplified signals $Q_i$ and $\overline{Q}_i$.

The operation of the circuit 200 is now described. Initially, the enable signal $E_{i-1}$ is a disabling or pre-charge phase low voltage level. The inverter 212 of the enable circuit 210 disables the sense amplifier 230 by outputting a disabling high voltage to the high voltage biasing node Si of the sense amplifier 230. The sense amplifier 230 therefore does not drive the $Q_i$ or $\overline{Q}_i$ output nodes to any particular voltage. Likewise, the enable circuit 250 refrains from enabling the NMOS differential network circuit 240 by refraining from driving the low voltage biasing node Si' of the NMOS differential network circuit 240 to the low voltage level. Thus, the NMOS differential network circuit 240 also refrains from driving the $Q_i$ or $\overline{Q}_i$ output nodes. On the other hand, the low voltage level enable signal $E_{i-1}$ turns on the drivers 222 and 224 of the pre-charge circuit 220 which, in turn, drive both the $Q_i$ and $\overline{Q}_i$ output nodes to the high voltage level. At, or shortly after, the time at which the pre-charge circuit 220 has driven the $Q_i$ and $\overline{Q}_i$ output nodes to the high voltage level, the inverter 214 outputs a low voltage level as the $E_i$ enable signal.

The H-ALCDL circuit 200, specifically, the NMOS differential network circuit 240, then receives the inputted signal(s) $Q_{i-1}$ either from a preceding asynchronous logic circuit or receives the inputted signal(s) $Q_0$ to which the entire complex logic function is applied. At, or shortly after, the time when the H-ALCDL circuit 200 receives the inputted signal(s) $Q_{i-1}$, the H-ALCDL circuit 200 receives a high voltage level enable signal $E_{i-1}$ (or global clock signal $E_0$). More particularly, the pre-charge circuit 220 receives the high voltage level enable signal $E_{i-1}$ and responds by refraining from driving the $Q_i$ and $\overline{Q}_i$ output nodes to any particular voltage. The enable circuit 250 receives the high voltage level enable signal $E_{i-1}$ and drives the low voltage biasing node Si' to the low voltage level. The NMOS differential network circuit 240 activates and applies its respective logic subfunction to the input signal(s) $Q_{i-1}$ to produce a result. The NMOS differential network circuit 240 then drives the $Q_i$ output node to a voltage corresponding to the result and the $\overline{Q}_i$ output node to a voltage corresponding to a complement of the result. The enable circuit 210 also receives the high voltage level enable signal $E_{i-1}$ and outputs the low voltage complement of the enable signal $\overline{E}_{i-1}$ to the low voltage biasing node Si. The sense amplifier 230 activates and drives one of the output nodes $Q_i$ or $\overline{Q}_i$ to the high voltage level and the other output node to the low voltage level, depending on whichever of the two output nodes $Q_i$ or $\overline{Q}_i$ is driven to a higher voltage by the NMOS differential network circuit 240. At, or shortly after, the time when the sense amplifier 230 has driven the $Q_i$ and $\overline{Q}_i$ output nodes to their respective high and low voltage levels, the enable circuit 210 outputs the high voltage level enable signal $E_i$.

Referring to FIG. 13, the L-ALCDL 300 is shown in greater detail. The L-ALCDL 300 functions in an analogous fashion as the H-ALCDL and is therefore only briefly described herein. The L-ALCDL 300 has an enable circuit 310, a pre-charge circuit 320, a sense amplifier 330, an NMOS differential network circuit 340 and a second enable circuit 350. The enable circuit 310 includes two inverters 312 and 314. The inverter 312 includes the PMOS transistor P3" and NMOS transistor N3" connected in a standard push-pull configuration. The inverter 314 includes the PMOS transistor P4" and the NMOS transistor N4" connected in push-pull configuration. The inverter 312 receives the enable signal $E_{i-1}$ (e.g., outputted from the previous $(i-1)^{th}$ asynchronous logic circuit in the sequence, or the global clock circuit if the H-ALCDL 200 is the first asynchronous logic circuit in the sequence). In response, the inverter 312 outputs the complement of the signal $E_{i-1}$, namely, $\overline{E}_{i-1}$ to the biasing node Si'" of the sense amplifier 330 and to the input of the inverter 314. The inverter 314 outputs the complement of the complement enable signal $\overline{E}_{i-1}$ as the outputted enable signal $E_i$. The inverters 312 and 314 are designed with a particular propagation delay so that the signal $E_i$ is not outputted until the result signal(s) $Q_i$ generated by the sense amplifier 330 are outputted.

The pre-charge circuit 320 includes two drivers 322 and 324. Illustratively, each of the drivers 322 and 324 is an NMOS transistor N5" or N6", respectively. The transistor N5" has a source connected to the low voltage level node GND and a drain (output) connected to the $Q_i$ output node of the L-ALCDL 300. The transistor N6" has a source connected to the low voltage level node GND and a drain (output) connected to the $\overline{Q}_i$ output node of the L-ALCDL 300. The gate of both transistors N5" and N6" receives the enable signal $E_{i-1}$. In response to a high voltage level enable signal $E_{i-1}$ (disabling or pre-charge polarity of enable signal), the driver 322 drives the $Q_i$ output node to the low voltage level and the driver 324 drives the $\overline{Q}_i$ output node to the low voltage level. Thus, the pre-charge circuit 320 pre-charges the $Q_i$ and $\overline{Q}_i$ output nodes. In response to a low voltage level enable signal $E_{i-1}$ (enabling or evaluate/apply polarity of enable signal), the drivers 322 and 324 are turned off and do not drive the $Q_i$ and $\overline{Q}_i$ output nodes to any particular voltage.

The sense amplifier 330 includes two inverters 332 and 334. The inverter 332 includes a PMOS transistor P1" and an NMOS transistor N1" connected in a push-pull configuration. The inverter 334 includes a PMOS transistor P2" and an NMOS transistor N2" connected in a push-pull configuration. The low voltage level biasing inputs of the inverters 332 and 334 are connected to the low voltage level node GND. The high voltage level biasing inputs of the inverters 332 and 334 are connected to the node Si". The input of the inverter 332 is connected to the output of the inverter 334, which is also connected to the $\overline{Q}_i$ output node. The input of the inverter 334 is connected to the output of the inverter 332, which is also connected to the $Q_i$ output node.

In operation, when the voltage at the node Si" is a low voltage level, the inverters 332 and 334 are not properly biased and therefore do not drive the $Q_i$ and $\overline{Q}_i$ output nodes to any particular voltage. This would occur when the inverter 312 of the enable circuit 310, in response to a high level enable signal $E_{i-1}$ outputs a low level complement enable signal $\overline{E}_{i-1}$ to the biasing node Si". On the other hand, when the voltage level of the node Si" is a high voltage level, the inverters 332 and 334 are properly biased. Whichever of the two signals $Q_i$ and $\overline{Q}_i$ is driven to the higher voltage (by the NMOS differential network circuit 340) controls the operation of the inverters 332 and 334. For instance, assume that the signal $Q_i$ is driven to a higher voltage level than the signal $\overline{Q}_i$. As such, the transistor P2" of the inverter 334 turns off and the transistor N2" turns on so as to drive the $\overline{Q}_i$ output node to the low voltage level. The drive of the signal $\overline{Q}_i$ to the low voltage level turns on the transistor P1" of the inverter 332 and turns off the transistor N1" so as to further drive the signal $Q_i$ to the high voltage level. If instead, the signal $\overline{Q}_i$ is driven to a higher voltage level than the signal $Q_i$, the transistor P1" of the inverter 332 is turned off and the transistor N1" is turned on to further drive down the voltage of the $Q_i$ output node to the low voltage. Likewise, the transistor P2" of the inverter 334 is turned on and the transistor N2" is turned off to further drive up the voltage of the $\overline{Q}_i$ output node to the high voltage level.

The NMOS differential network 340 is a connection of NMOS transistors that apply a particular subfunction of the complex function to the input signal(s) $Q_{i-1}$ to produce the result signals $Q_i$ and $\overline{Q}_i$. Note that the signal $\overline{Q}_i$ is the complement of the signal $Q_i$. Therefore, if the NMOS differential network 340 generates a high voltage level for the signal $Q_i$, the NMOS differential network 340 generates a low voltage level for the signal $\overline{Q}_i$ and vice-versa.

The NMOS differential network 340 has a high voltage biasing node Si''' to which the second enable circuit 350 is connected. The enable circuit 350 includes a PMOS transistor N7" having a source connected to the high voltage level node $V_{DD}$, a drain (output) connected to the high voltage biasing node Si''' and a gate receiving the enable signal $E_{i-1}$. When the enable voltage $E_{i-1}$ is a high voltage level (i.e., a disabling or pre-charge phase voltage), the transistor N7' is off and does not drive the high voltage biasing node Si''' to any particular voltage. As such, the NMOS differential network circuit 340 is not properly biased and is disabled (i.e., does not drive the signals $Q_i$ or $\overline{Q}_i$ to any particular voltage). On the other hand, when the enable signal $E_{i-1}$ is a low voltage level (i.e., an enabling or evaluate/apply phase voltage), the transistor N7' turns on and drives the high voltage biasing node Si''' to $V_{DD}$. This enables the NMOS differential network circuit 340. When enabled, the NMOS differential network 340 outputs a voltage level for the signal $Q_i$ to the $Q_i$ output node, and a voltage level for the signal $\overline{Q}_i$ to the $\overline{Q}_i$ output node.

The operation of the circuit 300 is now described. Initially, the enable signal $E_{i-1}$ is a disabling or pre-charge phase high voltage level. The inverter 312 of the enable circuit 310 disables the sense amplifier 330 by outputting a disabling low voltage to the high voltage biasing node Si" of the sense amplifier 330. The sense amplifier 330 therefore does not drive the $Q_i$ or $\overline{Q}_i$ output nodes to any particular voltage. Likewise, the enable circuit 350 refrains from enabling the NMOS differential network circuit 340 by refraining from driving the high voltage biasing node Si''' of the NMOS differential network circuit 340 to the high voltage level. Thus, the NMOS differential network circuit 340 also refrains from driving the $Q_i$ or $\overline{Q}_i$ output nodes. On the other hand, the high voltage level enable signal $E_{i-1}$ turns on the drivers 322 and 324 of the pre-charge circuit 320 which, in turn, drive both the $Q_i$ and $\overline{Q}_i$ output nodes to the low voltage level. At, or shortly after, the time at which the pre-charge circuit 320 has driven the $Q_i$ and $\overline{Q}_i$ output nodes to the low voltage level, the inverter 314 outputs a high voltage level as the $E_i$ enable signal.

The L-ALCDL circuit 300, specifically, the NMOS differential network circuit 340, then receives the inputted signal(s) $Q_{i-1}$ either from a preceding asynchronous logic circuit or receives the inputted signal(s) $Q_0$ to which the entire complex logic function is applied. At, or shortly after, the time when the L-ALCDL circuit 300 receives the inputted signal(s) $Q_{i-1}$, the L-ALCDL circuit 300 receives a low voltage level enable signal $E_{i-1}$ (or global clock signal $E_0$). More particularly, the pre-charge circuit 320 receives the low voltage level enable signal $E_{i-1}$ and responds by refraining from driving the $Q_i$ and $\overline{Q}_i$ output nodes to any particular voltage. The enable circuit 350 receives the low voltage level enable signal $E_{i-1}$ and drives the high voltage biasing node Si''' to the high voltage level. The NMOS differential network circuit 340 activates and applies its respective logic subfunction to the input signal(s) $Q_{i-1}$ to produce a result. The NMOS differential network circuit 340 then drives the $Q_i$ output node to a voltage corresponding to the result and the $\overline{Q}_i$ output node to a voltage corresponding to a complement of the result. The enable circuit 310 also receives the low voltage level enable signal $E_{i-1}$ and outputs the high voltage complement of the enable signal $\overline{E}_{i-1}$ to the high voltage biasing node Si". The sense amplifier 330 activates and drives one of the output nodes $Q_i$ or $\overline{Q}_i$ to the high voltage level and the other output node to the low voltage level, depending on whichever of the two output nodes $Q_i$ or $\overline{Q}_i$ is driven to a higher voltage by the NMOS differential network circuit 340. At, or shortly after, the time when the sense amplifier 330 has driven the $Q_i$ and $\overline{Q}_i$ output nodes to their respective high and low voltage levels, the enable circuit 310 outputs the low voltage level enable signal $E_i$.

Note that only one sense amplifier 230 or 330 for driving one pair of output signals $Q_i$ and $\overline{Q}_i$ is shown in the H-ALCDL 200 and L-ALCDL 300. This was simply for sake of illustration. Each H-ALCDL 200 or L-ALCDL 300 can receive multiple pairs of complimentary result signals. One sense amplifier 230 or 330 is provided for driving each pair of complementary result signals to the requisite high and low voltage levels. Each sense amplifier 230 or 330 must be connected to the pre-charge circuit 220 or 320 which illustratively can be provided with a pair of drivers 222, 224 or 322 and 324 for each sense amplifier 230 or 330. In such a case, each $Q_i$ is a vector of result signals. Note that the propagation delay of the enable circuits 210 and 310 are adjusted so as to coincide with the generation of the full vector of signals $Q_i$ from each H-ALCDL 200 or L-ALCDL 300.

FIG. 14 shows an exemplary NMOS differential network circuit 500 for the H-ALCDL 200 or L-ALCDL 300. Assuming the circuit 500 is in an $i^{th}$ H-ALCDL 200 or L-ALCDL 300, the signals $SUM_i$, $\overline{SUM}_i$, $CARRY_i$ and $\overline{CARRY}_i$ are the outputted result signals $Q_i$ and $\overline{Q}_i$. The signals X1i, X2i, X3i, X4i, X1i-1, X2i-1, X3i-1 and X4i-1 are the input signals $Q_{i-1}$.

Figure 9:
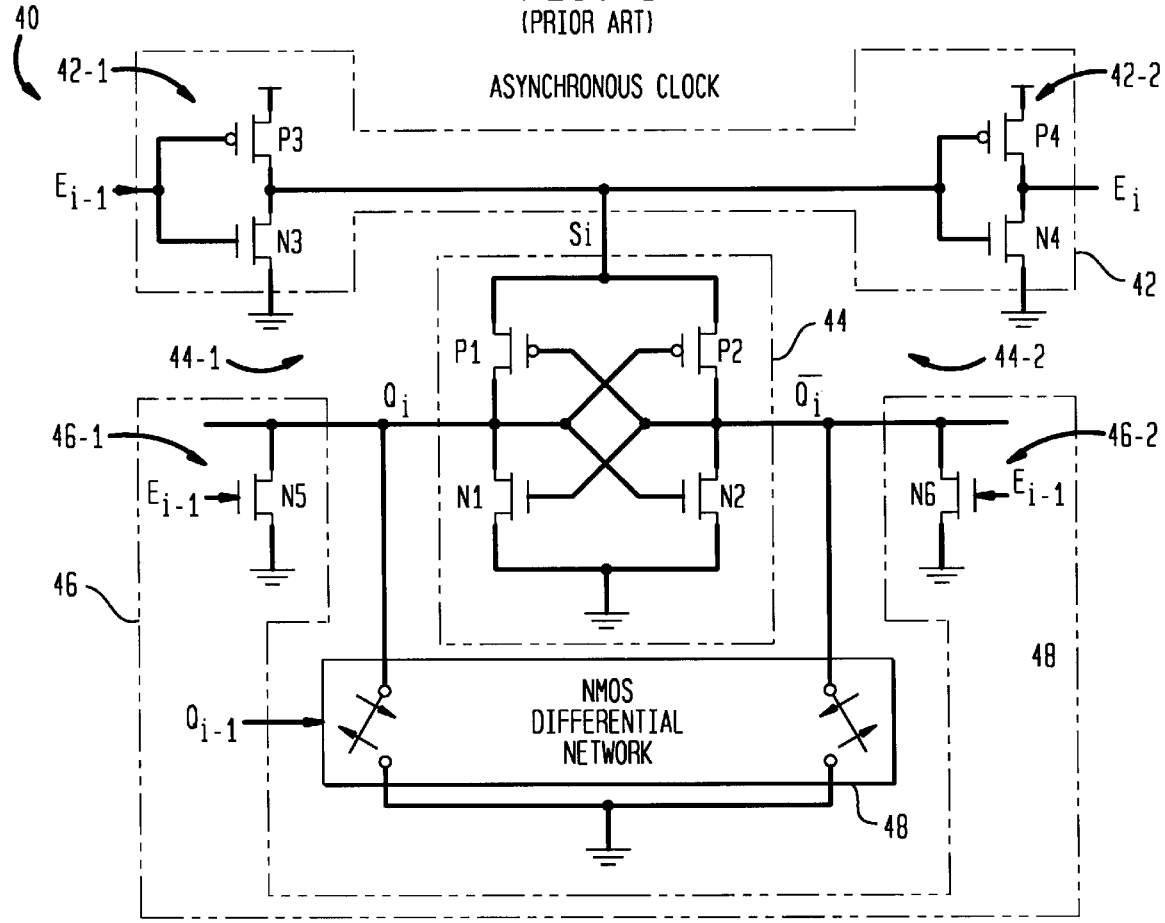
FIG. 9 shows a conventional asynchronous logic circuit of the architecture shown in FIG. 8.
Figure 10:
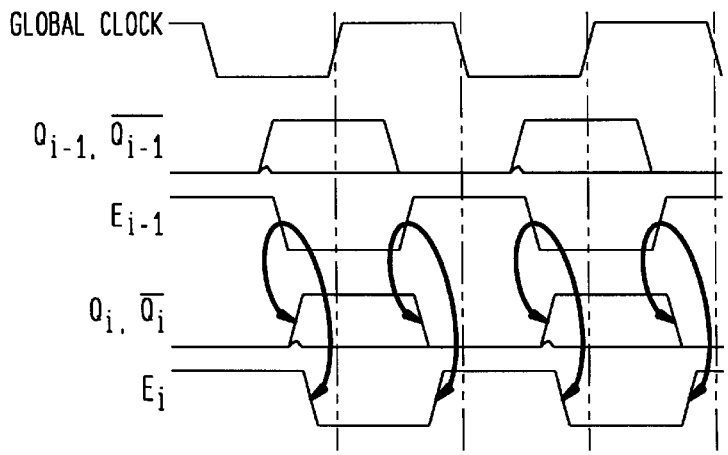
FIG. 10 shows a graph plotting timing signals of the circuit and architecture of FIGS. 8 and 9.
Figure 15:
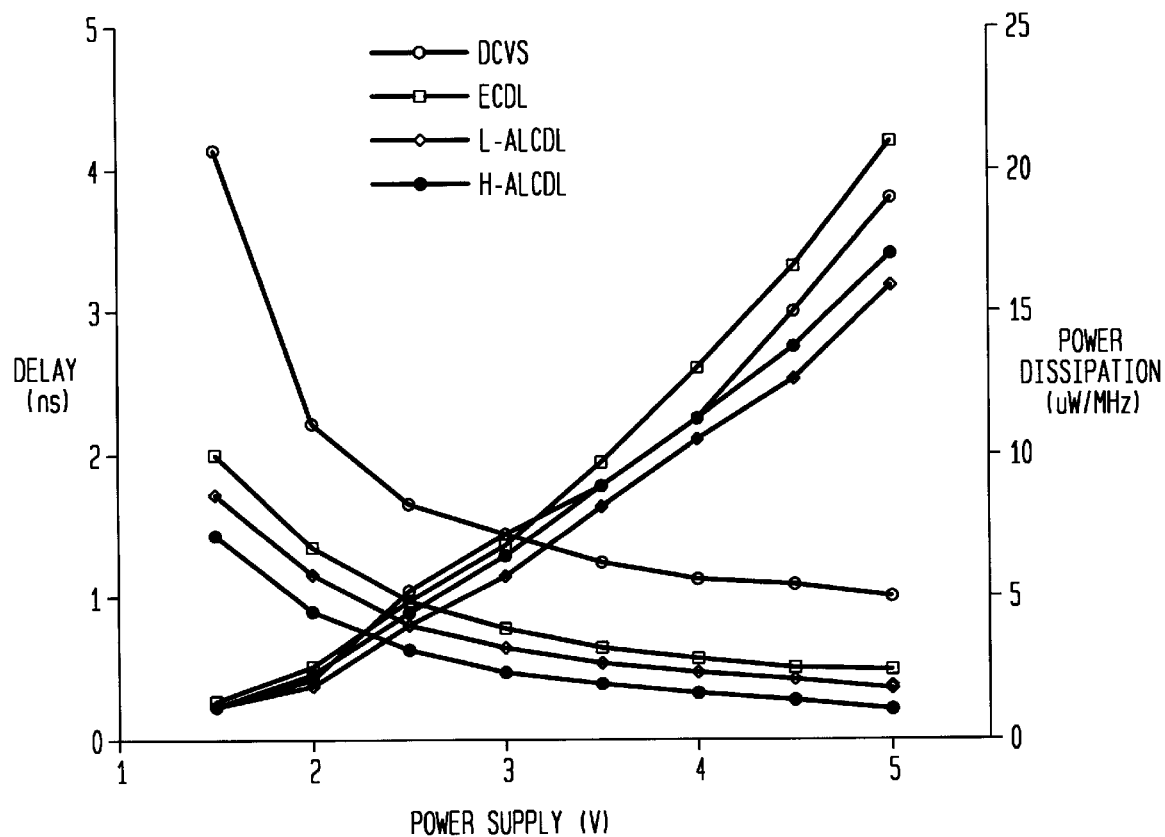
FIG. 15 shows a graph plotting the speed and power dissipation of the present invention as compared to the prior art.

Note the difference in cooperation of the sense amplifier 330 or 230, pre-charge circuit 320 or 220 and NMOS differential network circuit 340 or 240 in the L-ALCDL 300 or H-ALCDL 200 as opposed to the ECDL 40 (FIG. 9). In the H-ALCDL 200, the pre-charge circuit 220 drives the $Q_i$ and $\overline{Q}_i$ output nodes to one polarity voltage level and both the NMOS differential network circuit 240 and sense amplifier 230 drive one of the two output nodes $Q_i$ or $\overline{Q}_i$ to an opposite polarity voltage level. The NMOS differential network 240 drives the $Q_i$ output node via the path 241 and the $\overline{Q}_i$ output node via the path 242, whereas the sense amplifier 230 drives the $Q_i$ output node via the path 243 (including transistor P1') and the $\overline{Q}_i$ output node via the path 244 (including transistor P2'). In contrast, in the ECDL 40 only the sense amplifier 44 drives one of the two output nodes for the signals $Q_i$ or $\overline{Q}_i$ to an opposite polarity voltage level as they are driven by the pre-charge circuit 46. The NMOS differential network 48 can only influence the voltage levels outputted at the $Q_i$ and $\overline{Q}_i$ output nodes by resisting the drive of the sense amplifier 44, i.e., by driving one of the two output nodes for the signals $Q_i$ or $\overline{Q}_i$ to the same voltage as they were driven by the pre-charge circuit 46. As a result, the H-ALCDL 200 can drive the $Q_i$ and $\overline{Q}_i$ output nodes to their respective voltages in less time and utilizing less power. The only cost is the additional enable circuit 250. The same is true for the L-ALCDL 300. This is illustrated in FIG. 15 which plots the power dissipation and propagation delay of the conventional architecture 20 shown in FIG. 20, the ECDL 40 shown in FIG. 9, the H-ALCDL 200 and L-ALCDL 300.

LATCH CIRCUIT ARCHITECTURE

Figure 16:
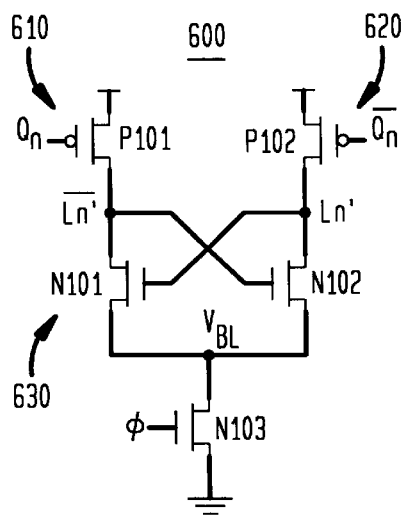
FIGS. 16 and 17 show an N-latch and a P-latch circuit according to another embodiment of the present invention.
Figure 17:
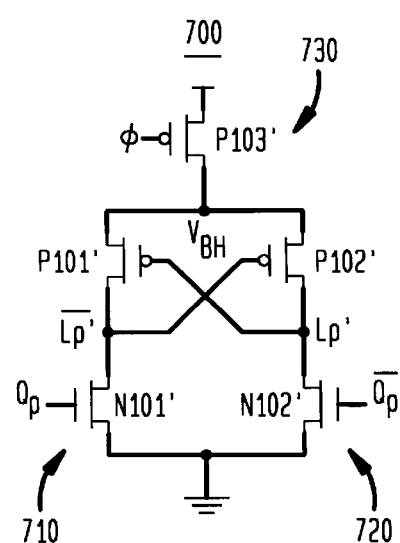

FIGS. 16 and 17 show latch circuit architectures 600 and 700 according to an embodiment of the present invention. The latch circuits 600 and 700 can be used in the circuit 100 of FIG. 11 or in the circuit 20 of FIG. 2. The latch circuit 600 receives the signal $Q_n$ and its complement $\overline{Q}_n$ (e.g., outputted by the last logic circuit 110-n, of a pre-charge low, evaluate high sequence of logic circuits) during a high voltage level clock pulse and stores the value of the signals $Q_n$ and $\overline{Q}_n$ during the high voltage level clock pulse. During a low voltage level clock pulse, the latch 600 is disabled and does not drive its output nodes (which output the signals $L_n'$ and $\overline{L}_n'$, respectively) to any particular voltage. Likewise, the latch circuit 700 receives the signal $Q_p$ and its complement $\overline{Q}_p$ (e.g., outputted by the last logic circuit 130-p, of a pre-charge high, evaluate low sequence of logic circuits) during a low voltage level clock pulse and stores the value of the signals $Q_p$ and $\overline{Q}_p$ during the high voltage level clock pulse. During a high voltage level clock pulse, the latch 700 is disabled and does not drive its output nodes (which output the signals $L_p'$ and $\overline{L}_p'$) respectively, to any particular voltage.

The latch 600 includes two inverters 610 and 620. The inverter 610 includes a PMOS transistor P101 and an NMOS transistor N101 that have their drains commonly connected to the output node that outputs the signal $\overline{L}_n'$. The source of the transistor P101 is connected to the high voltage level node $V_{DD}$. The source of the transistor N101 is connected to a low voltage level biasing input $V_{BL}$ of the inverters 610 and 620. The gate of the transistor P101 receives the signal $Q_n$. The gate of the transistor N101 is connected to the output of the inverter 620 at which the signal $L_n'$ is outputted. The inverter 620 includes a PMOS transistor P102 and an NMOS transistor N102 that have their drains commonly connected to the output node that outputs the signal $L_n'$. The source of the transistor P102 is connected to the high voltage level node $V_{DD}$. The source of the transistor N102 is connected to the low voltage level biasing input $V_{BL}$ of the inverters 610 and 620. The gate of the transistor P102 receives the signal $Q_n$. The gate of the transistor N102 is connected to the output of the inverter 610 at which the signal $L_n'$ is outputted.

An enable circuit 630 is provided which illustratively includes an NMOS transistor N103. The source of the transistor N103 is connected to the low voltage level node GND. The drain of the transistor 103 is connected to the low voltage level biasing input $V_{BL}$ of the inverters 610 and 620. The gate of the transistor N103 receives the global clock $\phi$.

In operation, when the voltage level of the global clock is a low voltage level, the transistor N103 is turned off. The enable circuit 630 therefore refrains from driving the low voltage level biasing node $V_{BL}$ to any particular voltage. As such, the inverters 610 and 620 are disabled and do not drive the $L_n'$ and $\overline{L}_n'$ output nodes to any particular voltage. Note that during this time, the signals $Q_n$ and $\overline{Q}_n$ illustratively are both driven to the high voltage level (one of the signals is already at the high voltage level, whereas the other signal, formerly at the low voltage level, transitions to the high voltage level) although this has no influence on the signals $L_n'$ and $\overline{L}_n'$.

Thereafter, the global clock transitions to the high voltage level. This causes the enable circuit transistor N103 to turn on and drive the low voltage biasing node $V_{BL}$ to the low voltage level. As such, the inverters 610 and 620 are enabled. However, initially, the signals $Q_n$ and $\overline{Q}_n$ are both at the high voltage level. Thus, both of the transistors P101 and P102 are initially turned off. Therefore, the transistors P101 and P102 do not drive the $L_n'$ and $\overline{L}_n'$ output nodes.

As noted above, the logic circuits which generate the result signals $Q_n$ and $\overline{Q}_n$ may evaluate all or part of a complex function during the high voltage level clock pulse. Invariably, after the leading (rising) edge of the global clock, but before the trailing (falling edge) of the global clock, one of the input signals $Q_n$ and $\overline{Q}_n$ transitions from the high voltage level to the low voltage level while the other input signal remains at the same high voltage level. Assume first that the signal $Q_n$ transitions to the low level. This low voltage level signal $Q_n$ is received at the transistor P101 which turns on and drives the $\overline{L}_n'$ output node to the high voltage level. This high voltage level signal $\overline{L}_n'$ is received at the gate of the transistor N102 of the inverter 620 which turns on and drives the $L_n'$ output node to the low voltage level. The low voltage level $L_n'$ signal is received at the transistor N101 of the inverter 610 which remains/turns off.

Assume now that the signal $\overline{Q}_n$, and not the signal $Q_n$, transitions to the low voltage level. This low voltage level signal $\overline{Q}_n$ is received at the transistor P102 which turns on and drives the $L_n'$ output node to the high voltage level. This high voltage level signal $L_n'$ is received at the gate of the transistor N101 of the inverter 610 which turns on and drives the $\overline{L}_n'$ output node to the low voltage level. The low voltage level $\overline{L}_n'$ signal is received at the transistor N102 of the inverter 620 which remains/turns off.

After the latch 600 stores one of the above noted choices of $L_n'$ and $\overline{L}_n'$ output signals (i.e., depending on which of the signals $Q_n$ and $\overline{Q}_n$ is driven to the low voltage level), the trailing edge of the high clock pulse is reached. The global clock transitions to the low voltage level pulse. As noted above, this causes the enable circuit 630 to disable the inverters 610 and 620 to prevent them from transitioning the outputted signals $L_n'$ and $\overline{L}_n'$. The signals $L_n'$ and $\overline{L}_n'$ outputted form the latch 600 therefore retain the value to which they were transitioned and may for instance be outputted to a low level evaluating logic circuit. During this time, both inputted signals $Q_n$ and $\overline{Q}_n$ are driven to the high voltage level although this has no effect on the outputted signals $L_n'$ and $\overline{L}_n'$.

The latch 700 has an analogous architecture and construction. The latch 700 includes two inverters 710 and 720. The inverter 710 includes a PMOS transistor P101' and an NMOS transistor N101' that have their drains commonly connected to the output node that outputs the signal $\overline{L}_p'$. The source of the transistor P101' is connected to a high voltage level biasing input $V_{BH}$ of the inverters 710 and 720. The source of the transistor N101' is connected to the low voltage level node GND. The gate of the transistor N101' receives the signal $Q_p$. The gate of the transistor P101 is connected to the output of the inverter 720 (at which the signal $L_p'$ is outputted). The inverter 720 includes a PMOS transistor P102' and an NMOS transistor N102' that have their drains commonly connected to the output node that outputs the signal $L_p'$. The source of the transistor P102' is connected to the high voltage level biasing input $V_{BH}$ of the inverters 710 and 720. The source of the transistor N102 is connected to the low voltage level node $V_{DD}$. The gate of the transistor N102' receives the signal $Q_p$. The gate of the transistor P102' is connected to the output of the inverter 710 at which the signal $L_p'$ is outputted.

An enable circuit 730 is provided which illustratively includes a PMOS transistor P103'. The source of the transistor P103' is connected to the high voltage level node $V_{DD}$. The drain of the transistor P103' is connected to the high voltage level biasing input $V_{BH}$ of the inverters 710 and 720. The gate of the transistor P103' receives the global clock φ.

In operation, when the voltage level of the global clock is a high voltage level, the transistor P103' is turned off. The enable circuit 730 therefore refrains from driving the high voltage level biasing node $V_{BH}$ to any particular voltage. As such, the inverters 710 and 720 are disabled and do not drive the $L_p'$ and $\overline{L}_p'$ output nodes to any particular voltage. Note that during this time, the signals $Q_p$ and $\overline{Q}_p$ illustratively are both driven to the low voltage level (one of the signals is already at the low voltage level, whereas the other signal, formerly at the high voltage level, transitions to the low voltage level) although this has no influence on the signals $L_p'$ and $\overline{L}_p'$.

Thereafter, the global clock transitions to the low voltage level. This causes the enable circuit transistor P103' to turn on and drive the high voltage biasing node $V_{BH}$ to the high voltage level. As such, the inverters 710 and 720 are enabled. However, initially, the signals $Q_p$ and $\overline{Q}_p$ are both at the high voltage level. Thus, both of the transistors N101' and N102' are initially turned off. Therefore, the transistors N101' and N102' do not drive the $L_p'$ and $\overline{L}_p'$ output nodes.

As noted above, the logic circuits that generate the result signals $Q_p$ and $\overline{Q}_p$ may evaluate all or part of a complex function during the low voltage level clock pulse. Invariably, after the leading (falling) edge of the low level clock pulse, but before the trailing (rising) edge of the low level clock pulse, one of the input signals $Q_p$ and $\overline{Q}_p$ transitions from the low voltage level to the high voltage level while the other input signal remains at the same low voltage level. Assume first that the signal $Q_p$ transitions to the high voltage level. This high voltage level signal $Q_p$ is received at the transistor N101' which turns on and drives the $\overline{L}_p'$ output node to the low voltage level. This low voltage level signal $\overline{L}_p'$ is received at the gate of the transistor P102' of the inverter 620 which turns on and drives the $L_p'$ output node to the high voltage level. The high voltage level signal $L_p'$ is received at the transistor P101' of the inverter 710 which remains/turns off.

Assume now that the signal $\overline{Q}_p$, and not the signal $Q_p$, transitions to the high voltage level. This high voltage level signal $\overline{Q}_p$ is received at the transistor N102' which turns on and drives the $L_p'$ output node to the low voltage level. This low voltage level signal $L_p'$ is received at the gate of the transistor P101' of the inverter 710 which turns on and drives the $\overline{L}_p'$ output node to the high voltage level. The high voltage level signal $\overline{L}_p'$ is received at the transistor P102' of the inverter 720 which remains/turns off.

After the latch 700 stores one of the above noted choices of $L_p'$ and $\overline{L}_p'$ output signals (i.e., depending on which of the signals $Q_p$ and $\overline{Q}_p$ is driven to the high voltage level), the trailing edge of the low level clock pulse is reached. The global clock transitions to the high voltage level pulse. As noted above, this causes the enable circuit 730 to disable the inverters 710 and 720 to prevent them from transitioning the outputted signals $L_p'$ and $\overline{L}_p'$. The signals $L_p'$ and $\overline{L}_p'$ outputted from the latch 700 therefore retain the value to which they were transitioned and may for instance be outputted to a high level evaluating logic circuit (or simply outputted as the result). During this time, both inputted signals $Q_p$ and $\overline{Q}_p$ are driven to the low voltage level although this has no effect on the outputted signals $L_p'$ and $\overline{L}_p'$.

Figure 20:
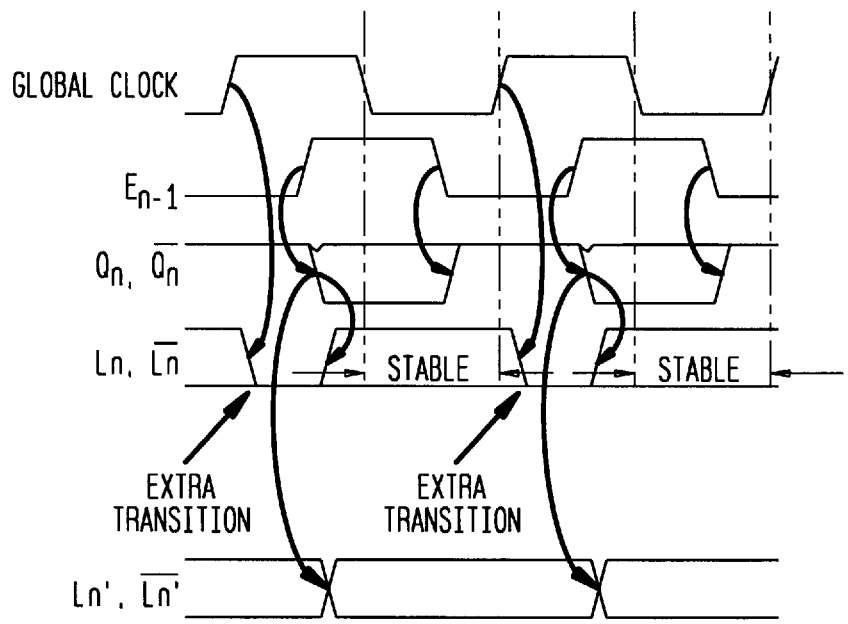
FIGS. 20 and 21 show an N-latch and a P-latch, respectively, according to yet another embodiment of the present invention.
Figure 21:
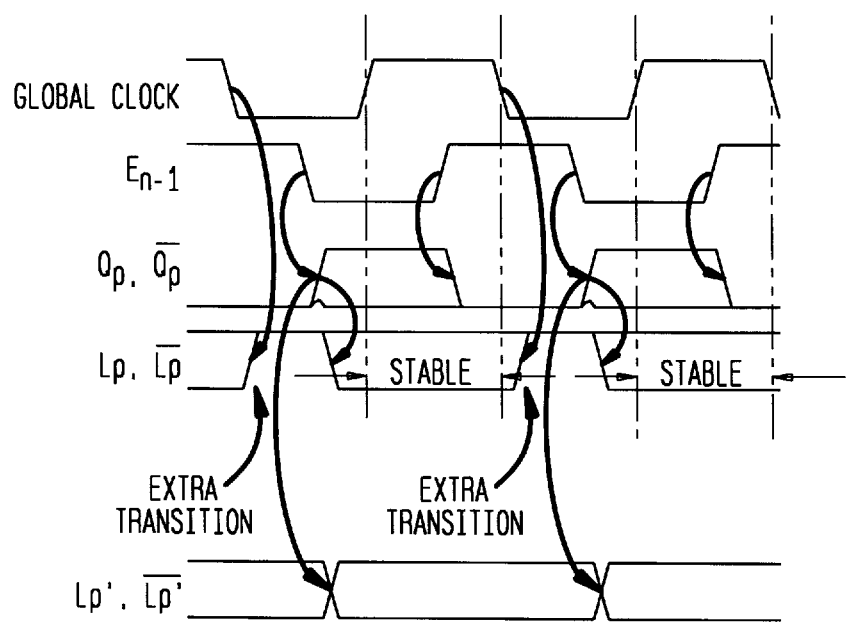

FIGS. 20 and 21 show plots of timing signals for the latches 600 and 700. For sake of comparison the outputs $L_n$ and $\overline{L}_n$ of the latch 24 and the outputs $L_p$ and $\overline{L}_p$ of the latch 28 are shown. Note that in FIG. 20, each signal $L_n'$ and $\overline{L}_n'$ outputted by the latch 600 according to the invention transitions only once during (between the leading and falling edges of) each high level clock pulse of the global clock. In stark contrast, one of the signals $L_n$ or $\overline{L}_n$ outputted by the latch 24 transitions two times during each high level clock pulse; once initially at the leading (rising edge) of the high level clock pulse and once when the one of the signals $Q_n$ and $\overline{Q}_n$ transitions. Likewise, in FIG. 21, each signal $L_p'$ and $\overline{L}_p'$ outputted by the latch 700 according to the invention transitions only once during (between the leading and falling edges of) each low level clock pulse whereas one of the signals $L_p$ or $\overline{L}_p$ outputted by the latch 28 transitions two times during each high level clock pulse.

Figure 18:
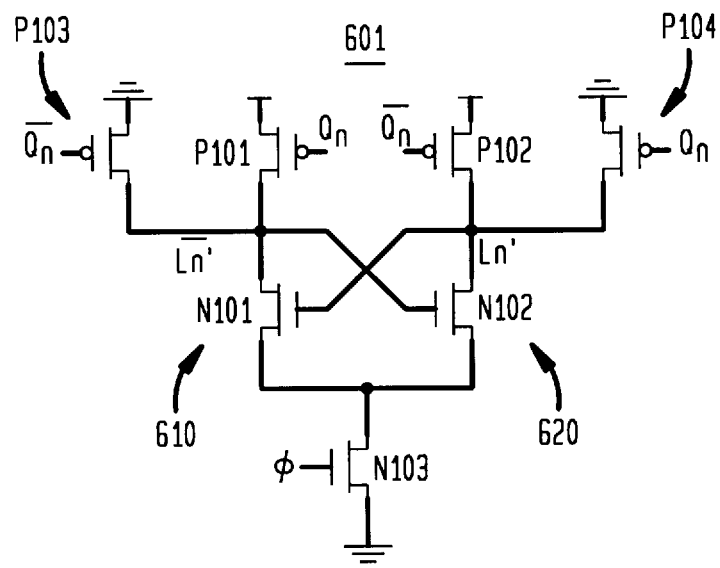
FIGS. 18 and 19 show graphs plotting timing signals of the latches-of FIGS. 16 and 17, respectively.
Figure 19:
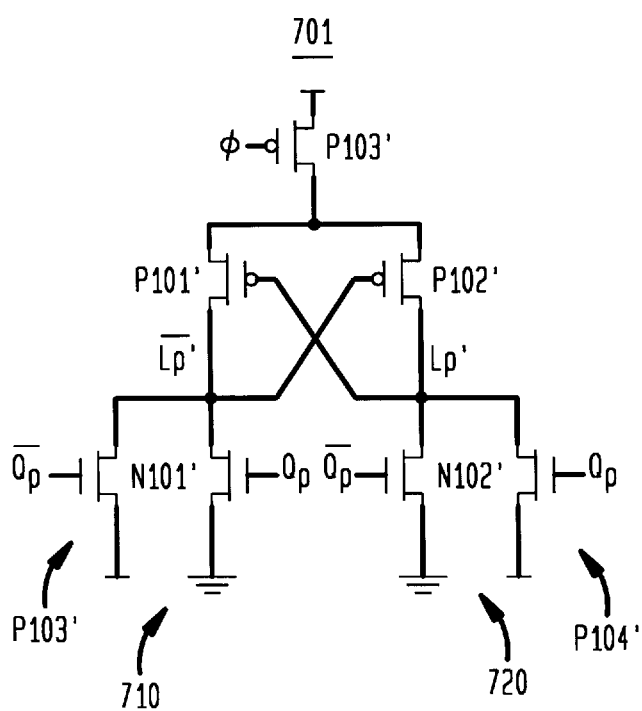

FIGS. 18 and 19 show another embodiment of the latches 601 and 701. The latch 601 is similar to the latch 600 except that additional drive transistors P103 and P104 are provided. The transistor P103 has a source connected to the low level voltage node GND, a drain connected to the $\overline{L}_n{}'$ output and a gate connected to the complement input signal $\overline{Q}_n$. The transistor P104 has a source connected to the low level voltage node GND, a drain connected to the $L_n{}'$ output and a gate connected to the input signal $Q_n$. The transistors P103 and P104 speed up the transient response of the inverters 610 and 620, respectively. In particular, when enabled by the enable circuit 630, if the signal $Q_n$ is at the high voltage level and the signal $\overline{Q}_n$ is at the low voltage level, the transistor P103 will turn on and assist the transistor N101 in driving the voltage level of the $\overline{L}_n{}'$ to the low voltage. Likewise, if the signal $Q_n$ is at the low voltage level and the signal $\overline{Q}_n$ is at the high voltage level, the transistor P104 will turn on and assist the transistor N102 in driving the voltage level of the $L_n{}'$ to the low voltage. Likewise, the latch 701 is similar to the latch 700 except that additional drive transistors N103' and N104' are provided. The transistor N103' has a source connected to the high voltage level node $V_{DD}$, a drain connected to the $\overline{L}_p{}'$ output and a gate connected to the complement input signal $\overline{Q}_p{}'$. The transistor N104' has a source connected to the high voltage level node $V_{DD}$, a drain connected to the $L_p{}'$ output and a gate connected to the input signal $Q_p$. The transistors N103' and N104' speed up the transient response of the inverters 710 and 720, respectively. In particular, when enabled by the enable circuit 730, if the signal $Q_p$ is at the low voltage level and the signal $\overline{Q}_p$ is at the high voltage level, the transistor N103' will turn on and assist the transistor P101' in driving the voltage level of the $\overline{L}_p{}'$ to the high voltage level. Likewise, if the signal $Q_n$ is at the high voltage level and the signal $\overline{Q}y_n$ is at the low voltage level, the transistor N104' will turn on and assist the transistor P102' in driving the voltage level of the $L_n{}'$ to the high voltage.

CONCLUSION

In short, a pipeline-able asynchronous logic circuit is provided that implements a subfunction of a logic function that is distributed into multiple sequential subfunctions. Each subsequent subfunction is applied to a result of an immediately preceding subfunction of the sequence. The asynchronous logic circuit has an output node and a differential logic circuit connected to the output node via a first path. The differential logic circuit applies a particular subfunction to an inputted signal to produce a result signal. The asynchronous logic circuit also has a sense amplifier that is connected to the output node via a second path which is distinct from the first path. The sense amplifier, in response to being enabled, amplifies the result signal produced by the differential logic circuit. The sense amplifier outputs the amplified result signal onto the output node. The asynchronous logic circuit also has a pre-charge circuit which pre-charges the output node to a first voltage, but only when the sense amplifier is disabled. Furthermore, the asynchronous logic circuit has a first enable circuit which responds to receiving an enable signal by enabling the sense amplifier and outputting the enable signal only when the sense amplifier outputs the amplified result signal. The differential logic circuit drives the output node via the first path, and the sense amplifier drives the output node via the second path, to a voltage corresponding to the result signal.

Illustratively, by providing two drive paths for the asynchronous logic circuit outputs, namely, one from the differential logic circuit, and one from the sense amplifier, the propagation delay between the time at which the enable signal and input signal are received and the time at which the result signal is outputted is reduced. Furthermore, the power consumption of the asynchronous logic circuit is also reduced.

Finally, the above-discussion is intended to be merely illustrative of the invention. Numerous alternative embodiments may be devised by those having ordinary skill in the art without departing from the spirit and scope of the following claims.

The claimed invention is:

1. A pipeline-able asynchronous logic circuit that implements a subfunction of a logic function that is distributed into multiple sequential subfunctions, each subsequent subfunction being applied to a result of an immediately preceding subfunction of said sequence, said asynchronous logic circuit comprising:

an output node, a differential logic circuit connected to said output node via a first path, for applying a particular subfunction to an inputted signal to produce a result signal, a sense amplifier, connected to said output node via a second path that is distinct from said first path, which, in response to being enabled, amplifies said result signal produced by said differential logic circuit and outputs said amplified result signal onto said output node, a pre-charge circuit which pre-charges said output node to a first voltage, but only when said sense amplifier is disabled, a first enable circuit which responds to receiving an enable signal by enabling said sense amplifier and outputting said enable signal only when said sense amplifier outputs said amplified result signal, and a second enable circuit which enables said differential logic circuit in response to receiving said same enable signal that is received at said first enable circuit, wherein said differential logic circuit drives said output node via said first path, and said sense amplifier drives said output node via said second path, to a voltage corresponding to said result signal.

2. The asynchronous logic circuit of claim 1 wherein said first enable circuit comprises:

a first inverter receiving said enable signal and outputting an inverted polarity enable signal, and a second inverter receiving said inverted enable signal and outputting a polarity inversion of said inverted polarity enable signal, having the same polarity as said enable signal, but delayed by at least a propagation delay period required by said differential logic circuit and said sense amplifier in driving said output node to said amplified result signal, wherein said inverted polarity enable signal biases said sense amplifier with a voltage that enables said sense amplifier.

3. The asynchronous logic circuit of claim 1 wherein said sense amplifier comprises:

a first level shifting inverter having a first input, a first output, and first and second biasing inputs, said first level shifting inverter being enabled in response to receiving a voltage of a first polarity at said first biasing input and a voltage of a second polarity at said second biasing input, a second level shifting inverter having a second input, a second output and third and fourth biasing inputs, said second level shifting inverter being enabled in response to receiving a voltage of said first polarity at said third biasing input and a voltage of said second polarity at said fourth biasing input, wherein said first input and said second output are connected to said output node, wherein said second input and first output are connected together, wherein said first and third biasing inputs receive an enabling control voltage from said enable circuit and wherein said second and fourth biasing inputs are connected to a node that receives a voltage of said second polarity, and wherein said first enable circuit outputs an enable control voltage of said first polarity in response to receiving said enable signal but otherwise outputs an enable control voltage of said second polarity.

4. The asynchronous logic circuit of claim 1 wherein said pre-charge circuit comprises a driver having an output connected to said output node, a biasing input connected to a node that receives a voltage of a first polarity and an input which receives said same enable signal as is received by said enable circuit, said driver circuit responding to a disabling voltage of said enable signal by charging said output node to a voltage of said first polarity and responding to an enabling voltage of said enable signal by refraining from charging said output node.

5. The asynchronous logic circuit of claim 1 wherein said amplified result signal outputted onto said output node by said sense amplifier is either a first polarity voltage or a second polarity voltage, which is lower than said first polarity voltage, and wherein said first voltage to which said pre-charge circuit drives said output node is said first polarity voltage.

6. The asynchronous logic circuit of claim 1 wherein said amplified result signal outputted onto said output node by said sense amplifier is either a first polarity voltage or a second polarity voltage, which is lower than said first polarity voltage, and wherein said first voltage to which said pre-charge circuit drives said output node is said second polarity voltage.

7. The asynchronous logic circuit of claim 1 further comprising:

a second output node connected to said differential logic circuit by a third path and connected to said sense amplifier by a fourth path, and a second pre-charging circuit which pre-charges said second output node to said first voltage when said sense amplifier is disabled, wherein if said logic value of said result signal corresponds to said first voltage, said differential logic circuit charges said second output node via said third path and said sense amplifier charges said second output node via said fourth path to a second voltage of opposite polarity with respect to said first voltage when said sense amplifier is enabled.

8. In a pipeline-able asynchronous logic circuit that implements a subfunction of a logic function that is distributed into multiple sequential subfunctions, each subsequent subfunction being applied to a result of an immediately preceding subfunction of said sequence, a method comprising the steps of:

applying a particular subfunction to an inputted signal to produce a result signal in a differential logic circuit, only in response to enabling a sense amplifier, using said sense amplifier to amplify said result signal produced by said differential logic circuit in said sense amplifier and outputting said amplified result signal from said sense amplifier onto an output node, only when said sense amplifier is disabled, using a pre-charge circuit to pre-charge said output node to a first voltage, in response to receiving an enable signal at a first enable circuit, using said first enable circuit to enable said sense amplifier and outputting said enable signal only when sense amplifier outputs said amplified result signal, in response to receiving said enable signal at a second enable circuit, using said second enable circuit to enable said differential logic circuit, and if a logic value of said result signal corresponds to said first voltage, charging said output node from said differential logic circuit via a first path and charging said output node from said sense amplifier charges via a second path, distinct from said first path, to a second voltage of opposite polarity with respect to said first voltage.

9. A synchronous logic circuit for applying a logic function that is distributed into multiple sequential subfunctions, each subsequent subfunction being applied to a result of an immediately preceding subfunction of said sequence comprising:

a sequence of plural logic circuits that are serially connected together, each of said logic circuits comprising:
an output node,
a differential logic circuit connected to said output node via a first path, for applying a particular subfunction to an inputted signal to produce a result signal,
a sense amplifier, connected to said output node via a second path that is distinct from said first path, which, in response to being enabled, amplifies said result signal produced by said differential logic circuit and outputs said amplified result signal onto said output node,
a pre-charge circuit which pre-charges said output node to a first voltage, but only when said sense amplifier is disabled, and
a first enable circuit which responds to receiving an enable signal by enabling said sense amplifier and outputting said enable signal only when sense amplifier outputs said amplified result signal,
wherein said differential logic circuit drives said output node via said first path, and said sense amplifier drives said output node via said second path to a voltage corresponding to said result signal, wherein a first logic circuit of said sequence receives a clock signal, as said enable signal, and an initial input signal on which said logic function is applied, as said inputted signal, and each other logic circuit receives, as said enable signal, an output enable signal generated by the preceding logic circuit, and as said inputted signal, said result signal generated by said preceding logic circuit, and a latch circuit for storing a result produced by a last logic circuit of said sequence of logic circuits.

10. The synchronous logic circuit of claim 9 wherein each logic circuit of said sequence is enabled by an enable signal of a first polarity, wherein said latch stores said result of said last logic circuit of said sequence during a clock pulse level of said first polarity, and wherein a second logic function applied to a result outputted from said latch is distributed over a second sequence of subfunctions, said synchronous logic circuit further comprising:

a second sequence of plural logic circuits, a first logic circuit of said second sequence receiving, as an enable signal, said clock signal, and, as an input signal, said result outputted from said latch, each of said logic circuits of said second sequence being enabled by an enable signal of a second polarity, that is opposite to said first polarity, and a second latch connected to a last one of said logic circuits of said second sequence and receiving said clock signal, wherein said second latch stores a result of said last logic circuit of said second sequence during a clock pulse level of said second polarity.

* * * * *